US010468352B2

(12) United States Patent
Lee

(10) Patent No.: US 10,468,352 B2
(45) Date of Patent: Nov. 5, 2019

(54) SEMICONDUCTOR PACKAGES WITH EMBEDDED BRIDGE INTERCONNECTS

(71) Applicant: Kyu-Oh Lee, Chandler, AZ (US)

(72) Inventor: Kyu-Oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/503,658

(22) PCT Filed: Sep. 19, 2014

(86) PCT No.: PCT/US2014/056662
§ 371 (c)(1),
(2) Date: Feb. 13, 2017

(87) PCT Pub. No.: WO2016/143779
PCT Pub. Date: Mar. 24, 2016

(65) Prior Publication Data
US 2017/0271264 A1 Sep. 21, 2017

(51) Int. Cl.
*H01L 23/538* (2006.01)
*H01L 23/00* (2006.01)
(Continued)

(52) U.S. Cl.
CPC ........ *H01L 23/5386* (2013.01); *H01L 21/486* (2013.01); *H01L 21/4853* (2013.01);
(Continued)

(58) Field of Classification Search
CPC ............. H01L 23/5386; H01L 21/6835; H01L 23/49827; H01L 23/49894; H01L 24/16;
(Continued)

(56) References Cited

U.S. PATENT DOCUMENTS 7,402,901 B2 6/2008 Hatano et al.
8,227,904 B2 6/2012 Braunisch et al.
(Continued)

FOREIGN PATENT DOCUMENTS

JP 2004111415 A 4/2004
JP 2006237054 A 9/2006
(Continued)

OTHER PUBLICATIONS

International Search Report and Written Opinion dated Jun. 19, 2015 for International Application No. PCT/US2014/056662, 12 pages.
(Continued)

*Primary Examiner* — Selim U Ahmed
(74) *Attorney, Agent, or Firm* — Schwabe, Williamson & Wyatt, P.C.

(57) ABSTRACT

Semiconductor packages with embedded bridge interconnects, and related assemblies and methods, are disclosed herein. In some embodiments, a semiconductor package may have a first side and a second side, and may include a bridge interconnect, embedded in a build-up material, having a first side with a plurality of conductive pads. The semiconductor package may also include a via having a first end that is narrower than a second end. The bridge interconnect and via may be arranged so that the first side of the semiconductor package is closer to the first side of the bridge interconnect than to the second side of the bridge interconnect, and so that the first side of the semiconductor package is closer to the first end of the via than to the second end of the via. Other embodiments may be disclosed and/or claimed.

22 Claims, 19 Drawing Sheets

(51) Int. Cl.
*H01L 23/498* (2006.01)
*H01L 21/48* (2006.01)
*H01L 21/683* (2006.01)
*H01L 25/065* (2006.01)
*H05K 3/46* (2006.01)

(52) U.S. Cl.
CPC ...... *H01L 21/4857* (2013.01); *H01L 21/6835* (2013.01); *H01L 23/49816* (2013.01); *H01L 23/49822* (2013.01); *H01L 23/49827* (2013.01); *H01L 23/49894* (2013.01); *H01L 24/16* (2013.01); *H01L 24/75* (2013.01); *H01L 24/81* (2013.01); *H01L 23/5389* (2013.01); *H01L 24/97* (2013.01); *H01L 25/0655* (2013.01); *H01L 2221/68359* (2013.01); *H01L 2224/131* (2013.01); *H01L 2224/13082* (2013.01); *H01L 2224/16227* (2013.01); *H01L 2224/16235* (2013.01); *H01L 2224/75743* (2013.01); *H01L 2224/81193* (2013.01); *H01L 2224/81203* (2013.01); *H01L 2224/97* (2013.01); *H01L 2924/1432* (2013.01); *H01L 2924/1434* (2013.01); *H01L 2924/15311* (2013.01); *H01L 2924/15313* (2013.01); *H05K 3/4682* (2013.01); *H05K 2201/10674* (2013.01)

(58) Field of Classification Search
CPC ............. H01L 23/49816; H01L 21/486; H01L 21/4853; H01L 2224/16227; H01L 2221/68359; H01L 2224/16235; H01L 23/48; H01L 21/60; H01L 21/56; H01L 21/50; H01L 23/498; H01L 23/495; H01F 5/00
See application file for complete search history.

(56) References Cited

U.S. PATENT DOCUMENTS

| | | | |
|---|---|---|---|
| 8,823,187 B2 | 9/2014 | Shimizu et al. | |
| 2004/0004293 A1* | 1/2004 | Murayama | H01L 23/49811 257/780 |
| 2004/0183187 A1 | 9/2004 | Yamasaki et al. | |
| 2010/0102457 A1* | 4/2010 | Topacio | H01L 21/565 257/777 |
| 2010/0288549 A1 | 11/2010 | Chiang et al. | |
| 2011/0215472 A1 | 9/2011 | Chandrasekaran | |
| 2012/0161316 A1 | 6/2012 | Gonzalez et al. | |
| 2012/0161330 A1 | 6/2012 | Hlad et al. | |
| 2012/0178219 A1 | 7/2012 | Babiarz et al. | |
| 2012/0234589 A1* | 9/2012 | Furuichi | H05K 3/4682 174/261 |
| 2013/0214432 A1 | 8/2013 | Wu et al. | |
| 2014/0070380 A1 | 3/2014 | Chiu et al. | |
| 2014/0117552 A1 | 5/2014 | Qian et al. | |
| 2014/0159850 A1 | 6/2014 | Roy et al. | |
| 2014/0174807 A1 | 6/2014 | Roy et al. | |
| 2014/0175636 A1 | 6/2014 | Roy et al. | |
| 2014/0264791 A1 | 9/2014 | Manusharow et al. | |
| 2015/0364422 A1* | 12/2015 | Zhai | H01L 24/81 257/773 |

FOREIGN PATENT DOCUMENTS

| | | |
|---|---|---|
| JP | 2009065115 A | 3/2009 |
| JP | 2009065116 A | 3/2009 |
| JP | 2010239126 A | 10/2010 |
| JP | 2011159666 A | 8/2011 |
| JP | 2014072279 A | 4/2014 |

OTHER PUBLICATIONS

Extended Search Report dated Mar. 26, 2018 for European Patent Application No. 14902138.8, 9 pages.
Office Action dated Apr. 3, 2018 for Japanese Patent Application No. 2017-505538, 13 pages.
Search Report dated Sep. 9, 2016 for Taiwan Patent Application No. 104127024, 4 pages.
Office Action dated Dec. 5, 2018, issued in corresponding Japanese Patent Application No. 2017-505538, 11 pages.
Office Action dated Jul. 31, 2019 for Japanese Patent Application No. 2017-505538, 12 pages.

* cited by examiner

US 10,468,352 B2

SEMICONDUCTOR PACKAGES WITH EMBEDDED BRIDGE INTERCONNECTS

CROSS REFERENCE TO RELATED APPLICATIONS

The present application is a national phase entry under 35 U.S.C. § 371 of International Application No. PCT/US2014/056662, filed Sep. 19, 2014, entitled "SEMICONDUCTOR PACKAGES WITH EMBEDDED BRIDGE INTERCONNECTS", which designated, among the various States, the United States of America. The Specification of the PCT/US 2014/056662 Application is hereby fully incorporated by reference.

TECHNICAL FIELD

The present disclosure relates generally to the field of semiconductor packages, and more particularly, to semiconductor packages with embedded bridge interconnects.

BACKGROUND

Conventional integrated circuit devices may include electrical contacts disposed on one side of the device. These electrical contacts may be used to couple the device to another component (e.g., via soldered connections). However, if the electrical contacts are not properly positioned on the side of the device (e.g., are located in an improper distance from a face of the device), it may be difficult to form electrical connections between the device and the other component.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
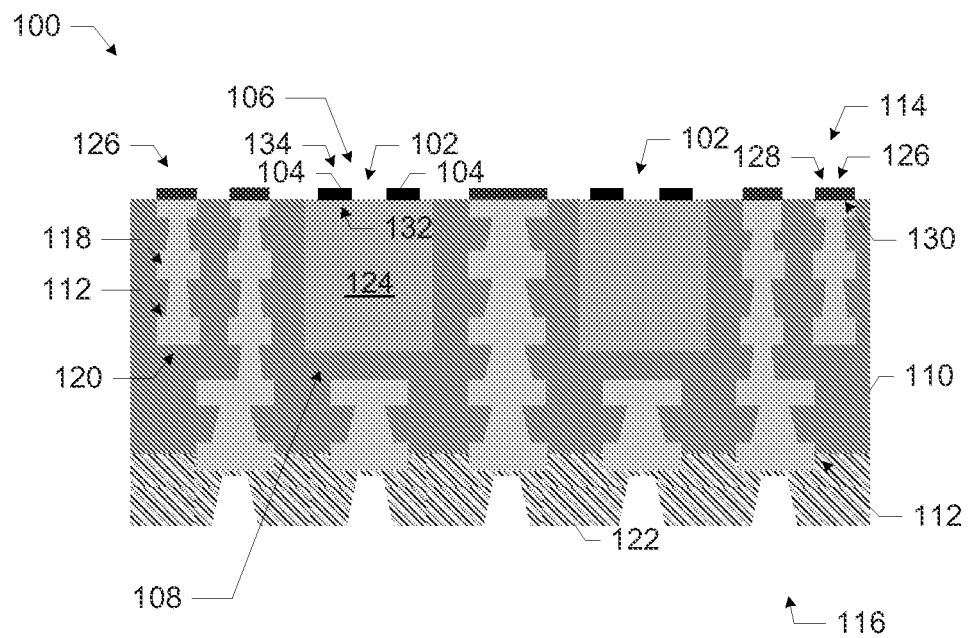
FIGS. 1 and 2 are side, cross-sectional views of semiconductor packages with embedded bridge interconnects, in accordance with various embodiments.

Semiconductor packages with embedded bridge interconnects, and related assemblies and methods, are disclosed herein. In some embodiments, a semiconductor package may include a bridge interconnect and a via. The bridge interconnect may be embedded in a build-up material, and may have a first side with a plurality of conductive pads and a second side opposite the first side. The via may extend through a portion of the build-up material, and may have a first end that is narrower than a second end of the via. The semiconductor package may have a first side and an opposing second side, and the bridge interconnect may be arranged in the semiconductor package such that a distance between the first side of the bridge interconnect and the first side of the semiconductor package is less than a distance between the second side of the bridge interconnect and the first side of the semiconductor package. The via may be arranged in the semiconductor package such that a distance between the first end of the via and the first side of the semiconductor package is less than a distance between the second end of the via and the first side of the semiconductor package.

Various embodiments disclosed herein may be particularly useful in applications in which a silicon-based bridge interconnect is included in an integrated circuit assembly with an organic substrate. Devices based on organic substrates may be less expensive to manufacture than silicon-based devices, but may be less amenable to the formation of fine features than silicon. In applications in which high feature density or small feature size is desired, forming such features on an organic substrate may be excessively difficult or impossible, and silicon substrates may be used instead.

To address this issue, silicon-based structures may be included in organic substrate devices. The silicon-based structures may include the high feature density or small feature size portions of the device, and may be embedded or otherwise included in a device with an organic substrate. This approach may allow local small or high density features to be achieved without having to form the entire device out of silicon (which may be prohibitively expensive, large, and/or process intensive).

Silicon-based bridge interconnects may be one particularly useful example of silicon-based structures included in organic substrate devices. A bridge interconnect may be used to route signals between two components, such as a central processing unit (CPU) and a memory device. In some embodiments disclosed herein, a bridge interconnect may provide a high density signal pathway between two components. Such high density signal pathways may be essential to the successful implementation of next generation memory device technology, such as High Bandwidth Memory (HBM) and Wide I/O 2 (WIO2), in which it is desirable for a memory device and a CPU to communicate with each other using very dense package designs. Thus, various embodiments of the semiconductor packages with embedded bridge interconnects disclosed herein, and the related assemblies and techniques, may enable the successful implementation of these high density memory technologies (and other high density or small feature size applications).

In particular, in order to attach two high density components to each other, tighter component placement tolerance requirements may be required to achieve successful alignment and coupling. Thermal compression bonding may be a useful process for achieving this alignment and coupling. In thermal compression bonding, a bond head may place a first component (e.g., a die) on a first surface of a second component (e.g., a package, another die, or any other component) to which the first component is to be bonded. The second component may be attached to a pedestal by an applied vacuum pulling on a surface opposite the first surface. As the vacuum pulls the second component "flat" against the pedestal, it is desirable for the first surface to be substantially flat (or, in other words, for relevant features on the first surface to be approximately coplanar). This desired outcome may be referred to as "top coplanarity." Without substantially coplanar features on the first surface, it is difficult to achieve consistent bonding between the first and second components. These problems may be exacerbated in organic devices, since chemical mechanical polishing (typically used to achieve flat surfaces between deposition of different layers in silicon devices) is typically not performed in organic manufacturing (due to, e.g., cost).

Conventional manufacturing processes, however, typically fail to meet the coplanarity requirements for successful bonding. This is often a consequence of the inherent manufacturing variance during deposition and placement of various layers of the first component (e.g., those arising during the organic lamination process). Conventionally, attempts to reduce the variation in thickness that results in poor top coplanarity focus on copper metal density, copper plating, and the build-up lamination process. However, these attempts may be inherently limited, as there will always be some inherent variation on the "top" and "back" sides of a component resulting from the copper plating process, the build-up material lamination process, and solder resist material variations, for example. For flip-chip structures, for example, it may be nearly impossible to provide an end-of-the-line structure with little to no variation (i.e., good top coplanarity) as may be required in certain applications. These previous attempts also incur significant expense during the manufacturing process. Moreover, techniques that require extremely flat copper or other specialized materials to achieve a desired top coplanarity may ultimately limit the design options available for the structure of the component.

Various embodiments disclosed herein include techniques for the manufacture of semiconductor packages and integrated circuit assemblies that use coreless processing techniques to fabricate components having very good top coplanarity (e.g., with very small or almost zero variation). This top coplanarity may enable the use of thermal compression bonding in the die attachment process, even at extremely fine feature spacing (e.g., bump pitch below 130 microns).

In some embodiments, the semiconductor packages disclosed herein may utilize the surface of a first build-up layer laminated onto a peelable sacrificial core as a "C4" or flip-chip connection side. A bridge interconnect (e.g., a silicon bridge interconnect) may be embedded in a cavity (formed, e.g., by a laser after formation of a first or second metal layer) and the cavity may be filled using a build-up resin or other material between the bridge interconnect and the cavity. By using the surface of the first build-up layer as the C4 side (to which a die may be attached), the C4 side will be as flat as the profile of the surface of the peelable core. If the package, once detached from the sacrificial core, later deforms (due, e.g., to residual stresses resulting from coefficient of thermal expansion mismatch, and shrinkage imbalance during the build curing and copper aging processes), the warped package can still be "flattened" so as to achieve good top coplanarity on the C4 side (using, e.g., mechanical and/or vacuum forces, as discussed below). Presenting a substantially coplanar surface to a die to which the semiconductor package is to be attached may improve the connection between the semiconductor package and bumps on the die during a thermal compression bonding process.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous. As used herein, the phrase "coupled" may mean that two or more elements are in direct physical or electrical contact, or that two or more elements are not in direct contact with each other, but yet still cooperate or interact with each other (e.g., via one or more intermediate elements, which may perform their own transformations or have their own effects). For example, two elements may be coupled to each other when both elements communicate with a common element (e.g., a common circuit element). As used herein, the term "logic" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

Figure 2:
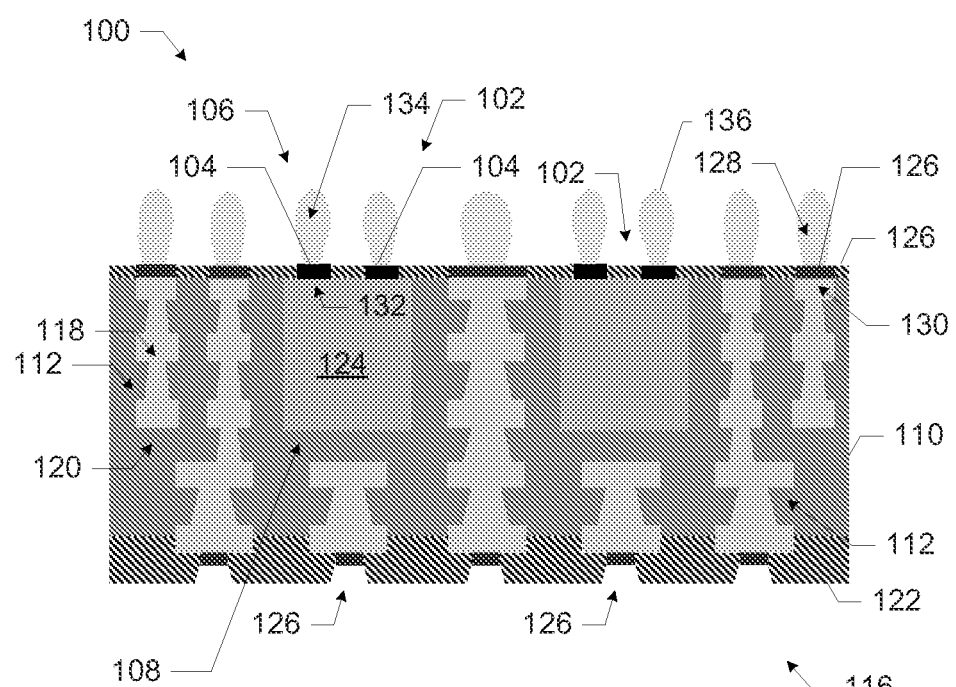

FIGS. 1 and 2 are side, cross-sectional views of semiconductor packages 100 with embedded bridge interconnects 102, in accordance with various embodiments. The bridge interconnect 102 may be embedded in a build-up material 110. In some embodiments, the bridge interconnect 102 may be a silicon bridge. The bridge interconnect 102 may have a first side 106 with a plurality of conductive pads 104. Although two conductive pads 104 are illustrated in FIGS. 1 and 2 for each illustrated bridge interconnect 102, any desired number of conductive pads 104 may be included on the first side 106 of a bridge interconnect 102. In some embodiments, the bridge interconnect 102 may have a body 124 in contact with the conductive pads 104. In particular, each of the conductive pads 104 may have a first face 134 and an opposing second face 132, and the second face 132 may contact the body 124 of the bridge interconnect 102. The bridge interconnect 102 may have a second side 108 opposite the first side 106.

The build-up material 110 may be any suitable build-up material conventionally used in the fabrication of semiconductor packages, such as an Ajinomoto Built-up Film (ABF) type material. In some embodiments, the build-up material 110 may be inorganic build-up material, such as SiOx or SiNx.

The semiconductor package 100 may also include one or more vias 112. Only a few of the vias 112 illustrated in FIGS. 1 and 2 are labeled with reference numerals for ease of illustration. Additionally, although FIGS. 1 and 2 illustrate particular arrangements of vias 112 (e.g., to form particular conductive pathways), any desired arrangement of one or more vias 112 may be included in the semiconductor package 100 in various embodiments.

The vias 112 may extend through a portion of the build-up material 110, and may have a first end 118 and a second end 120. The first end 118 of the via 112 may be narrower than the second end 120 of the via 112. This shape may be a result of the manufacturing techniques used to form the vias 112 in the build-up material 110, as discussed below.

In some embodiments, none of the conductive pads 104 of the bridge interconnects 102 may be in electrical contact with any of the vias 112 in the build-up material 110 of the semiconductor package 100 (e.g., as shown in FIGS. 1 and 2). In some embodiments, multiple ones of the conductive pads 104 may be spaced apart by a solder resist 122 (e.g., as illustrated in the embodiment of FIG. 2). In some embodiments, the conductive pads 104 may not be spaced apart by a solder resist (e.g., as illustrated in the embodiment of FIG. 1).

The semiconductor package 100 may itself have a first side 114 and an opposing second side 116. In some embodiments, a layer of solder resist 122 may be disposed on the second side 116 of the semiconductor package 100.

The bridge interconnect 102 may be arranged in the semiconductor package 100 such that a distance between the first side 106 of the bridge interconnect 102 in the first side 114 of the semiconductor package 100 is less than a distance between the second side 108 of the bridge interconnect 102 in the first side 114 of the semiconductor package 100. In other words, in some embodiments, the bridge interconnect 102 may be arranged so that the first side 114 of the semiconductor package 100 is closer to the first side 106 of the bridge interconnect 102 than to the second side 108 of the bridge interconnect 102. In some embodiments (e.g., as shown in FIG. 1), a surface of the first side 114 of the semiconductor package 100 may include the conductive pads 104, and thus the distance between the first side 106 of the bridge interconnect 102 and the first side 114 of the semiconductor package 100 may be effectively zero or very small.

The via 112 may be arranged in the semiconductor package 100 such that a distance between the first end 118 of the via 112 in the first side 114 of the semiconductor package 100 is less than a distance between the second end 120 of the via 112 in the first side 114 of the semiconductor package 100. In other words, in some embodiments, the first side 114 of the semiconductor package 100 may be closer to the first end 118 of the via 112 than to the second end 120 of the via 112.

In some embodiments, the second side 116 of the semiconductor package 100 may be a first layer interconnect side, and the first side 114 of the semiconductor package 100 may be a second layer interconnect side. For example, the second side 116 of the semiconductor package 100 of FIG. 2 may be a first layer interconnect side, and the first side 114 of the semiconductor package 100 of FIG. 2 may be a second layer interconnect side. In some embodiments, solder resist (e.g., the solder resist 122) may be disposed on the second layer interconnect side.

In some embodiments, the semiconductor package 100 may include one or more contacts 126. Only a few of the contacts 126 illustrated in FIGS. 1 and 2 are labeled with reference numerals for ease of illustration. Additionally, although FIGS. 1 and 2 illustrate particular arrangements of contacts 126, any desired arrangement of one or more contacts 126 may be included in the semiconductor package 100. A contact 126 may be formed from a conductive material different from the material of the conductive pads 104. For example, in some embodiments, the contact 126 may be formed from nickel while the conductive pads 104 may be formed from copper (and, in some embodiments, coated with nickel).

The contact 126 may have a first face 128 and an opposing second face 130. In some embodiments, the first face 128 of the contact 126 may be in approximately the same plane as the first faces 134 of the conductive pads 104. In some such embodiments, the contact 126 and the conductive pads 104 may be disposed on the first side 114 of the semiconductor package 100 and may be positioned for coupling with one or more dies, as discussed below. For example, the contact 126 of the conductive pads 104 may be positioned for thermal compression bonding to one or more dies.

In some embodiments, a solder bump 136 may be disposed on one or more of the conductive pads 104 and/or one or more of the contacts 126. An example of such an embodiment is shown in FIG. 2. Only one of the solder bumps 136 in FIG. 2 is labeled with a reference numeral for ease of illustration. Although FIG. 2 illustrates a particular arrangement of solder bumps 136, any desired arrangement of one or more solder bumps 136 may be included in the semiconductor package 100 in various embodiments.

In some embodiments, the semiconductor package 100 may be formed at least in part on a surface of a sacrificial core. In particular, the first side 114 of the semiconductor package 100 may be disposed between the sacrificial core and a second side 116 of the semiconductor package 100. After the sacrificial core is removed, at least a portion of the first side 114 of the semiconductor package 100 may have a profile complementary to a profile of the surface of the sacrificial core. Various embodiments include a high-density bridge embedding processing using the first one or more build-up layers in addition to a monolithic coreless substrate manufacturing process. A number of examples of manufacturing techniques including sacrificial cores are discussed below.

FIGS. 3-17 are side, cross-sectional views of assemblies subsequent to various operations in the manufacture of an integrated circuit assembly 1700 (FIG. 17) including the semiconductor package 100 of FIG. 1, in accordance with various embodiments. Although the operations illustrated in FIGS. 3-17 and discussed below are represented as occurring in a particular order, these operations may be performed in any suitable order, and various operations may be omitted or repeated as desired. Additionally, although FIGS. 3-17 illustrate various operations that may be used to manufacture the integrated circuit assembly 1700 including the semiconductor package 100 of FIG. 1, any other suitable set of operations for manufacturing the semiconductor package 100 and/or the integrated circuit assembly 1700 may be used instead of the operations discussed below.

Figure 3:
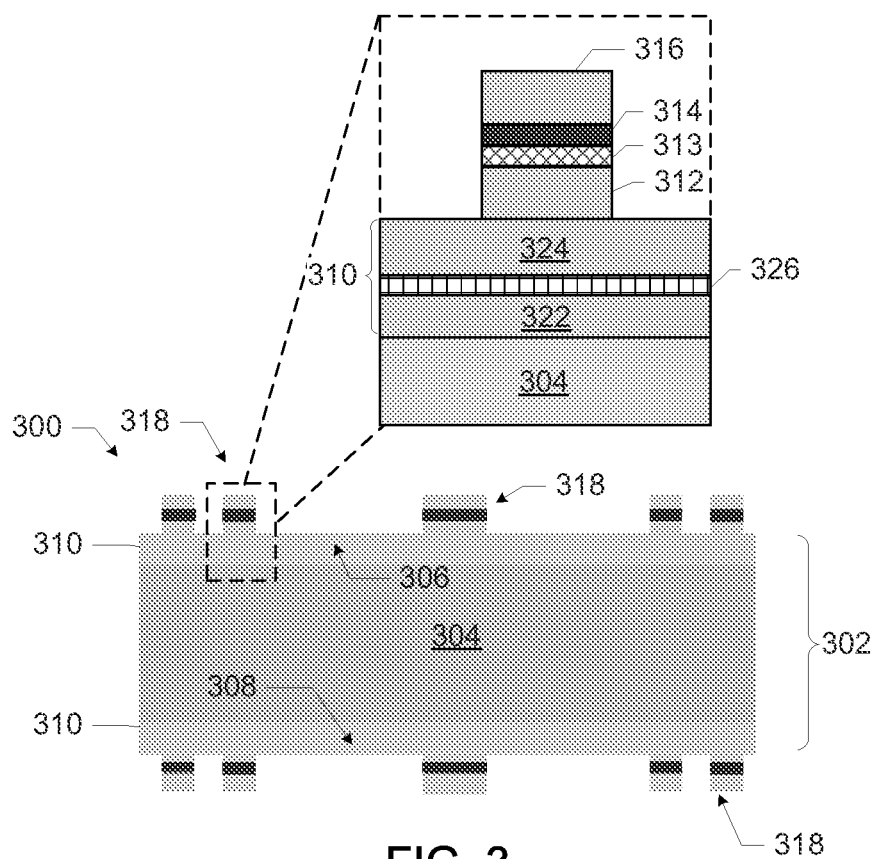
FIGS. 3-17 are side, cross-sectional views of assemblies subsequent to various operations in the manufacture of an integrated circuit assembly including the semiconductor package of FIG. 1, in accordance with various embodiments.

FIG. 3 illustrates an assembly 300 subsequent to forming metal structures 318 on a first surface 306 and on a second surface 308 of a sacrificial core 302. The sacrificial core 302 may include a body material 304 disposed between foils 310. In some embodiments, a foil 310 may include an inner foil layer 322 (e.g., a copper foil), an outer foil layer 324 (e.g., a copper foil), and an adhesive layer 326 disposed between the inner foil layer 322 and the outer foil layer 324. The adhesive layer 326 may temporarily adhere the inner foil layer 322 to the outer foil layer 324 until the outer foil layer 324 and the inner foil layer 322 are "peeled apart." Thus, the adhesive layer 326 may act as a release layer for the release of the sacrificial core 302, enabling the inner foil layer 322 to be "peeled" away from the outer metal layer 324 once the body material 304 has been removed, providing a "peelable" core. The sacrificial core 302 may be constructed in accordance with known techniques, and is thus not discussed in further detail.

The foils 310 may provide the first surface 306 and the second surface 308 on which the metal structures 318 may be disposed. The metal structures 318 may include a first layer 312, a second layer 313, a third layer 314, and a fourth layer 316. In some embodiments, the first layer 312 and the fourth layer 316 may be formed of one conductive material, while the second layer 313 and the third layer 314 may be formed of different conductive material(s) than the first layer 312 and the fourth layer 316. For example, in some embodiments, the first layer 312 and the fourth layer 316 may be formed of copper, while the second layer 313 may be formed of gold and the third layer 314 may be formed of nickel. Any suitable layer in the metal structure 318 (e.g., the first layer 312) may be formed by electroplating. In some embodiments, the second layer 313, the third layer 314 and the fourth layer 316 of a metal structure 318 may form a contact 126 of the semiconductor assembly 100 of FIG. 1, as discussed below.

In some embodiments, the metal structures 318 formed on the first surface 306 may be "mirror images" of the metal structures 318 formed on the second surface 308 relative to the sacrificial core 302, as illustrated in FIG. 3. In some embodiments, most if not all manufacturing operations performed on the sacrificial core 302 (e.g., those illustrated in FIGS. 3-12) may be performed so as to form mirror-image structures on the first surface 306 and the second surface 308 of the sacrificial core 302. Accordingly, for ease of illustration, only the structures formed on the first surface 306 (and the manufacturing operations related to the formation of those structures) may be discussed with reference to FIGS. 3-12. However, as illustrated in FIGS. 3-12, mirror-image structures may also be formed on the second surface 308 (e.g., by performing identical or analogous manufacturing operations).

Figure 4:
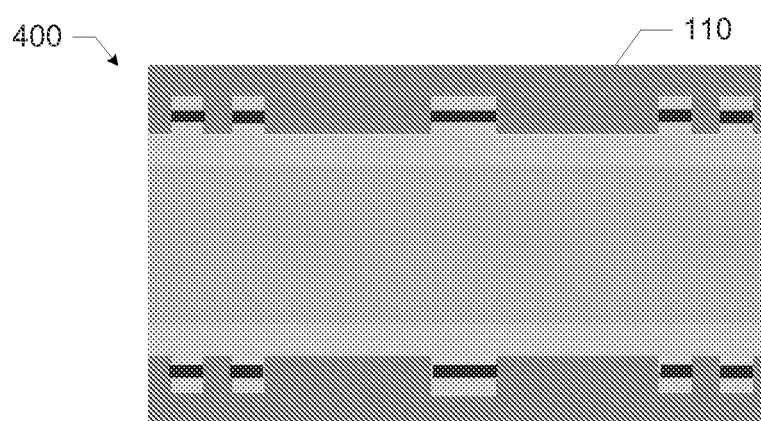

FIG. 4 illustrates an assembly 400 subsequent to providing a build-up material 110 on the first surface 306 of the sacrificial core 302 of the assembly 300 (FIG. 3). As shown, in some embodiments, the build-up material 110 may surround and extend beyond the metal structures 318 (FIG. 3).

Figure 5:
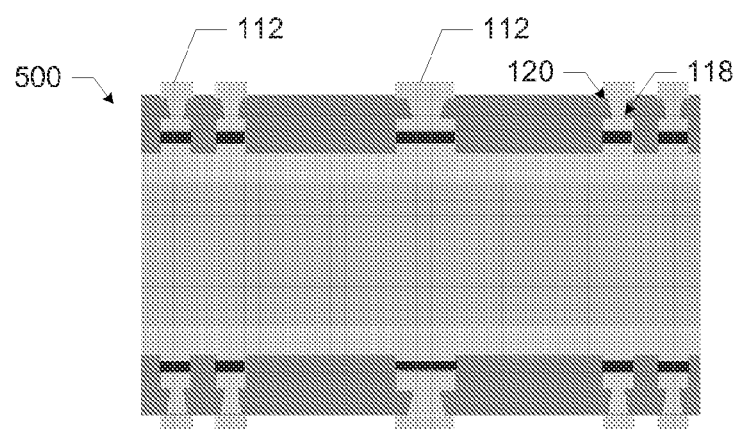

FIG. 5 illustrates an assembly 500 subsequent to forming one or more vias 112 through the build-up material 110 of the assembly 400 (FIG. 4). As shown, in some embodiments, one or more of the vias 112 may extend through the build-up material 110 to contact one or more corresponding ones of the metal structures 318 (FIG. 3). The first end 118 of a via 112 in the assembly 500 may be narrower than the second end 120 of the via 112. The first end 118 of a via 112 in the assembly 500 may be disposed between the second end 120 of the via 112 and the first surface 306 of the sacrificial core 302. In other words, the first surface 306 of the sacrificial core 302 may be closer to the first end 118 of a via 112 than to the second end 120 of the via 112. The assembly 500 may be formed from the assembly 400 using, for example, a conventional microvia fabrication technique, a dry film resist technique, and a patterned plating technique.

Figure 6:
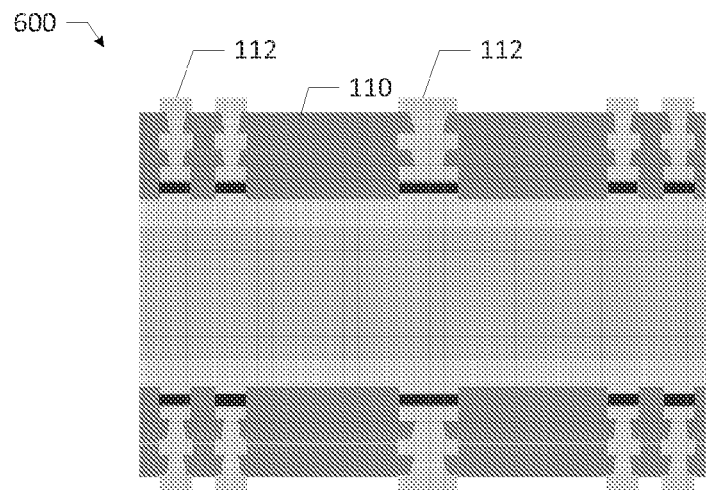

FIG. 6 illustrates an assembly 600 subsequent to providing additional build-up material 110 to the assembly 500 (FIG. 5) and forming additional vias 112 through the build-up material 110. As shown, in some embodiments, one or more of the vias 112 newly provided in the assembly 600 may extend through the build-up material 110 to contact one or more corresponding existing vias 112 and/or metal structures 318 (FIG. 3). The first end 118 of a newly added via 112 in the assembly 600 may be narrower than the second end 120 of the via 112. The first end 118 of a newly added via 112 in the assembly 600 may be disposed between the second end 120 of the via 112 and the first surface 306 of the sacrificial core 302. In other words, the first surface 306 of the sacrificial core 302 may be closer to the first end 118 of a newly added via 112 than to the second end 120 of the via 112. The assembly 600 may be formed from the assembly 500 using, for example, a conventional microvia fabrication technique, a dry film resist technique, and a patterned plating technique.

Figure 7:
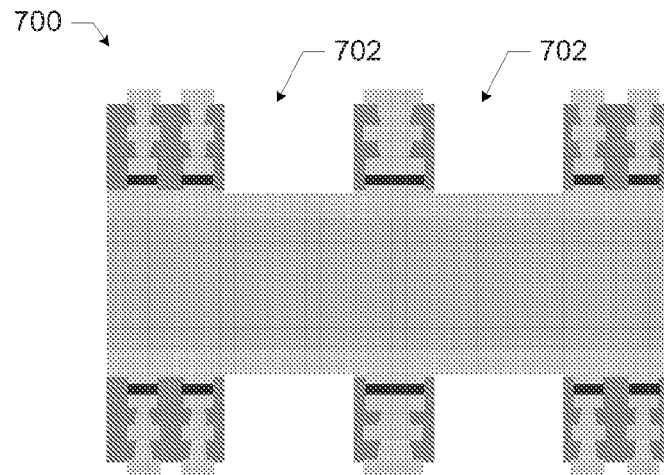

FIG. 7 illustrates an assembly 700 subsequent to forming one or more cavities 702 in the build-up material 110 of the assembly 600 (FIG. 6). In some embodiments, the cavity 702 may extend down to the first surface 306 of the sacrificial core 302 (FIG. 3). The cavity 702 may be formed by a laser (e.g., through laser ablation).

Figure 8:
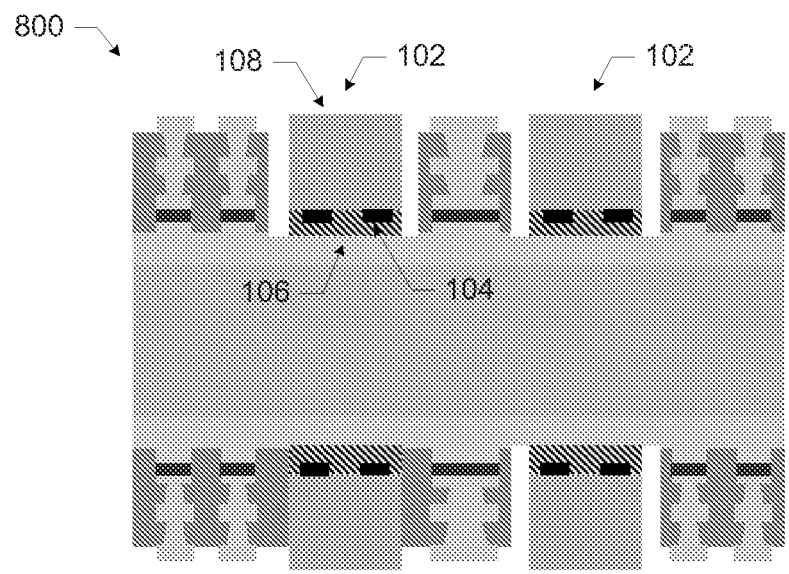

FIG. 8 illustrates an assembly 800 subsequent to disposing one or more bridge interconnects 102 in the cavities 702 (FIG. 7) of the assembly 700. As discussed above with reference to FIGS. 1 and 2, and as reproduced in FIG. 9, a bridge interconnect 102 may have a first side 106 with a plurality of conductive pads 104, and may have a second side 108 opposite to the first side 106. As illustrated in FIG. 8, a bridge interconnect 102 may be disposed in a cavity 702 such that the first side 106 of the bridge interconnect 102 is closer to the first surface 306 (FIG. 3) of the sacrificial core 302 than the second side 108 is to the first surface 306. In other words, the first side 106 of the bridge interconnect 102 may be disposed between the first surface 306 of the sacrificial core 302 and the second side 108 of the bridge interconnect 102.

Figure 9:
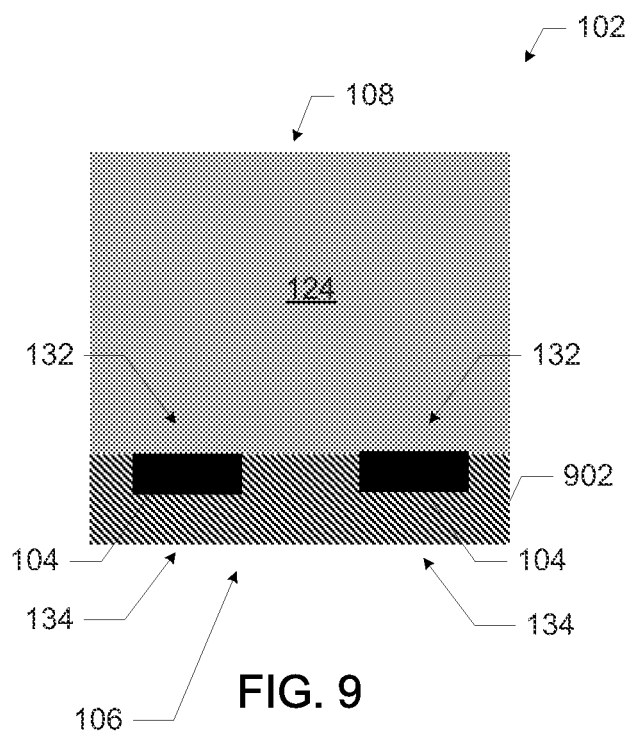

As shown in FIG. 9, in some embodiments, a die backside film 902 may be disposed on the bridge interconnect 102 (e.g., on the first face 134 of the conductive pads 104 and/or on the body 124) when the bridge interconnect 102 is disposed in a cavity 702. The one or more bridge interconnects 102 may be disposed in the assembly 800 during a pick-and-place process.

In some embodiments, the second layer 313, the third layer 314 and the fourth layer 316 of the metal structures 318 may become the contacts 126 (as discussed below with reference to FIGS. 10-17). In the resulting packages, the first face 128 of the contact 126 may be substantially coplanar with the first face 134 of the conductive pads 104 (as discussed above with reference to FIGS. 1 and 2). In some embodiments of the bridge interconnect 102, only two layers of material may separate the body material 304 (FIG. 3) of the sacrificial core 302 from the conductive pads 104; namely, the foil 310 and the die backside film 902. Similarly, only two layers of material may separate the body material 304 of the sacrificial core 302 from the second layer 313 (which may provide a surface of the contacts); namely, the foil 310 and the first layer 312. Thus, it may be possible to achieve good alignment of the second layer 313 and the conductive pads 104 if the surface of the body material 304 is substantially flat, and the thickness of the foil 310, the die backside film 902, and the first layer 312 are controlled. Controlling just these variables may enable a substantial improvement in planarity over conventional techniques in which outward-facing contacts are formed toward the "end," rather than toward the "beginning," of the manufacturing process.

Figure 10:
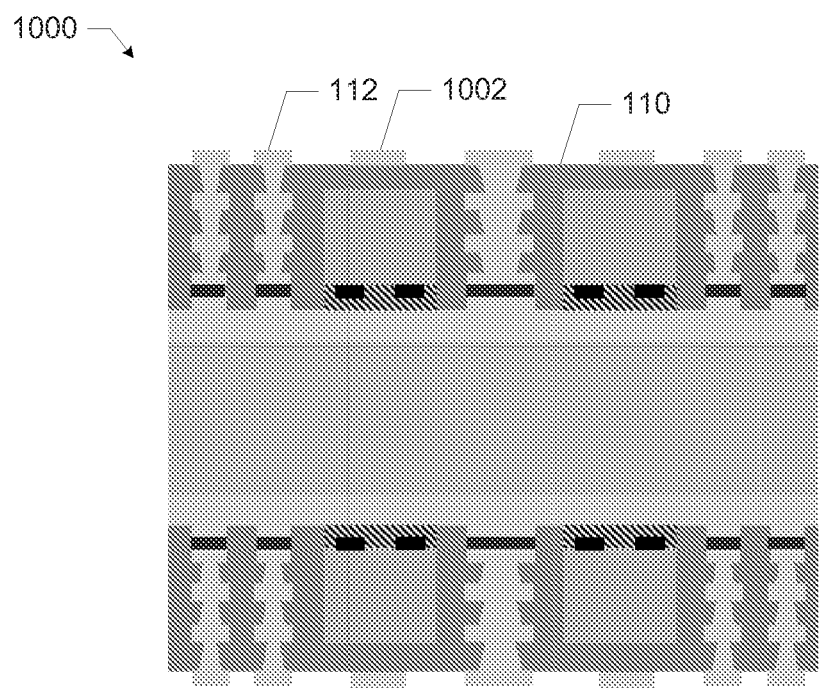

FIG. 10 illustrates an assembly 1000 subsequent to providing additional build-up material 110 on the assembly 800 (FIG. 8) to embed the bridge interconnects 102, and the formation of additional conductive structures 1002 on the surface of the newly provided build-up material 110. The conductive structures 1002 may be coupled with other structures (e.g., vias) in subsequent manufacturing operations. The assembly 1000 is also illustrated subsequent to forming additional vias 112 through the build-up material 110 (relative to the assembly 900 of FIG. 9). As shown, in some embodiments, one or more of the vias 112 newly provided in the assembly 600 may extend through the build-up material 110 to contact one or more corresponding existing vias 112 and/or metal structures 318 (FIG. 3). The first end 118 of a newly added via 112 in the assembly 600 may be narrower than the second end 120 of the via 112. The first end 118 of a newly added via 112 in the assembly 600 may be disposed between the second end 120 of the via 112 and the first surface 306 of the sacrificial core 302. In other words, the first surface 306 of the sacrificial core 302 may be closer to the first end 118 of a newly added via 112 than to the second end 120 of the via 112. The assembly 1000 may be formed from the assembly 900 using, for example, a conventional microvia fabrication technique, a dry film resist technique, and a patterned plating technique.

Figure 11:
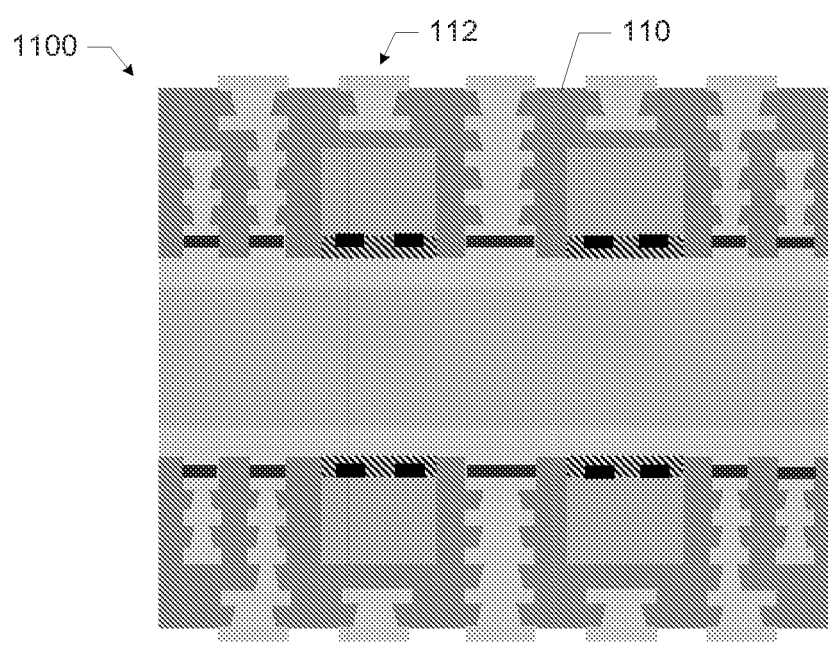

FIG. 11 illustrates an assembly 1100 subsequent to providing additional build-up material 110 on the assembly 1000 (FIG. 10) and forming additional vias 112 through the build-up material 110. As shown, in some embodiments, one or more of the vias 112 newly provided in the assembly 600 may extend through the build-up material 110 to contact one or more corresponding existing vias 112 and/or metal structures 318 (FIG. 3). The first end 118 of a newly added via 112 in the assembly 600 may be narrower than the second end 120 of the via 112. The first end 118 of a newly added via 112 in the assembly 600 may be disposed between the second end 120 of the via 112 and the first surface 306 of the sacrificial core 302. In other words, the first surface 306 of the sacrificial core 302 may be closer to the first end 118 of a newly added via 112 than to the second end 120 of the via 112.

Figure 12:
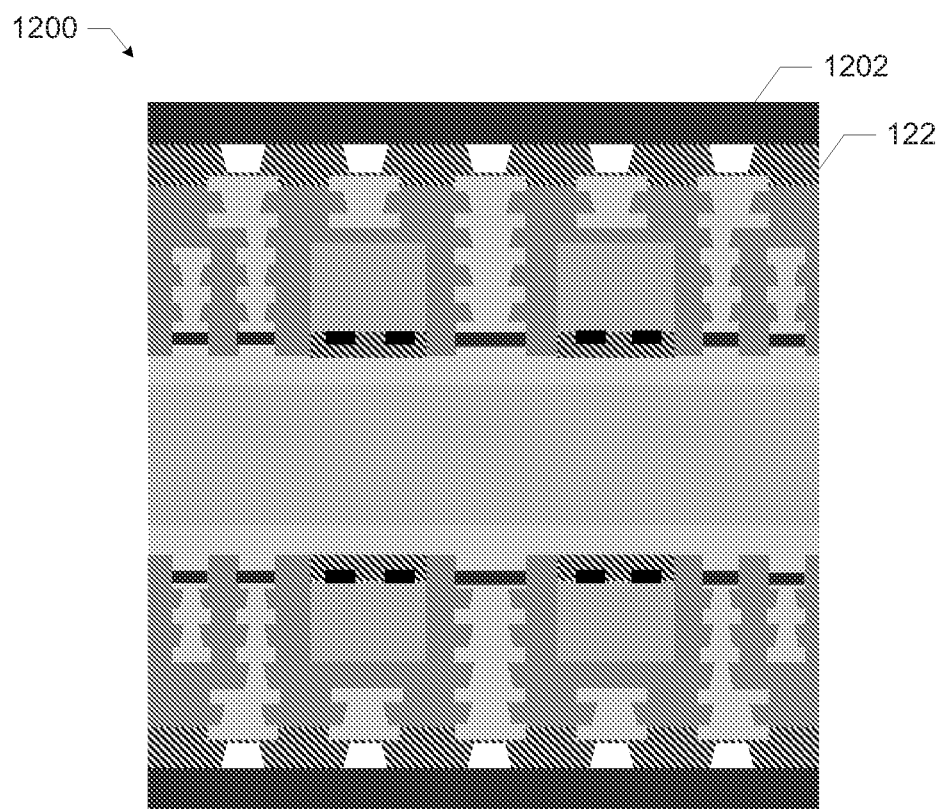

FIG. 12 illustrates an assembly 1200 subsequent to providing a patterned solder resist 122 to the assembly 1100 (FIG. 11) and also providing a film 1202 to cover the patterned solder resist 122 and underlying structures. In some embodiments, the film 1202 may be a polyethylene terephthalate (PET) material. The film 1202 may protect the underlying structures from subsequent etching processes, as discussed below.

Figure 13:
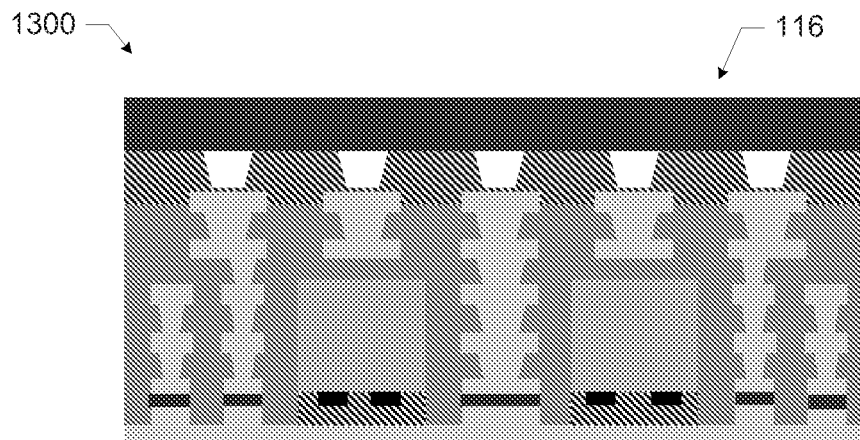

FIG. 13 illustrates an assembly 1300 subsequent to removing the body material 304 (FIG. 3) of the sacrificial core 302 from the assembly 1200 (FIG. 12). This process may be referred to as "depaneling," and may be performed in accordance with conventional techniques. The result of this removal may be the formation of two assemblies 1300 (due to the prior mirror-image manufacturing operations), but only one of the assemblies 1300 is shown in FIG. 13 for ease of illustration. The manufacturing operations discussed below with reference to FIGS. 14-17 may be performed on each of the two assemblies 1300 formed by the removal of the body material 304 in parallel, in series, or in any desired order. Upon depaneling, the inner foil layer 322 may be removed, and only the outer foil layer 324 may remain as part of the assembly 1300.

Figure 14:
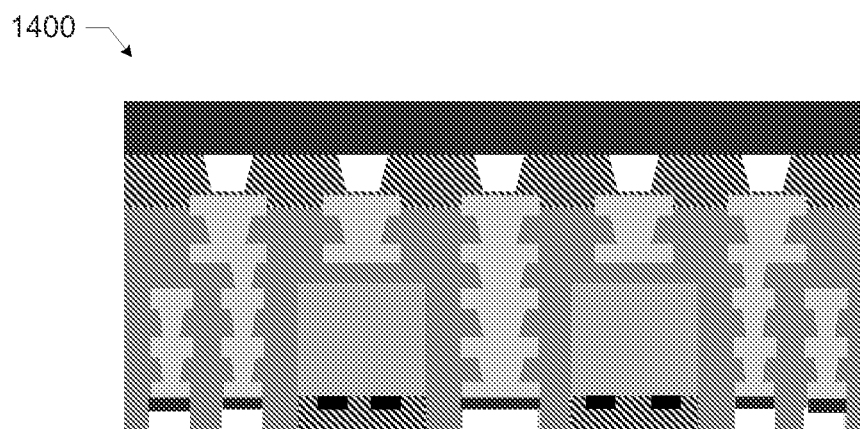

FIG. 14 illustrates an assembly 1400 subsequent to removing the outer foil layer 324 (FIG. 3) of the sacrificial core 302 from the assembly 1300 (FIG. 13). The outer foil layer 324 may be removed by any suitable etching process. The first layer 312 of the metal structures 318 (FIG. 3) may also be removed during the removal of the outer foil layer 324 or subsequent to the removal of the outer foil layer 324, as shown. For example, in some embodiments, the outer foil layer 324 and the first layer 312 may both be formed of copper, and removed with a copper etch process. The removal of the first layer 312 of the metal structures 318 may expose the second layer 313 of the metal structures 318 (FIG. 3). The combination of the second layer 313, the third layer 314 and the fourth layer 316 may be subsequently referred to in the discussion of FIGS. 15-17 as a contact 126. In embodiments in which the outer foil layer 324 and the first layer 312 of the metal structures 318 are formed from copper, the second layer 313 may be formed from nickel and the nickel may act as an "etch stop" that may prevent the copper etching process once the nickel is reached. The die backside film 902 may prevent the conductive pads 104 from being etched during the copper etching process.

Figure 15:
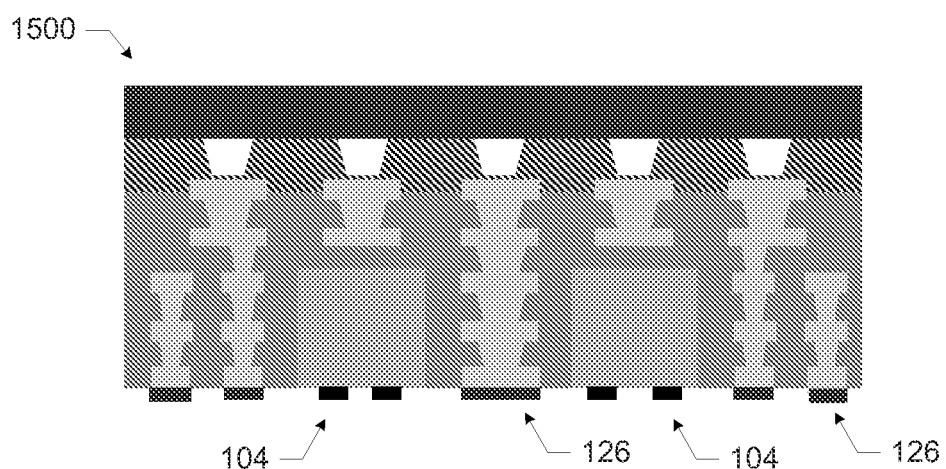

FIG. 15 illustrates an assembly 1500 subsequent to removing the die backside film 902 (FIG. 9) from the bridge interconnects 102 (e.g., from the first face 134 of the conductive pads 104) and also to removing the build-up material 110 disposed between the contacts 126, and the build-up material 110 disposed between the contacts 126 and the conductive pads 104 of the bridge interconnect 102. The die backside film 902 may be removed by plasma etching, for example. The assembly 1500 may take the form of the semiconductor package 100 of FIG. 1 with the addition of the film 1202 disposed on the second side 116 of the semiconductor package 100. In particular, the conductive pads 104 and the contacts 126 may be exposed in the assembly 1500.

Figure 16:
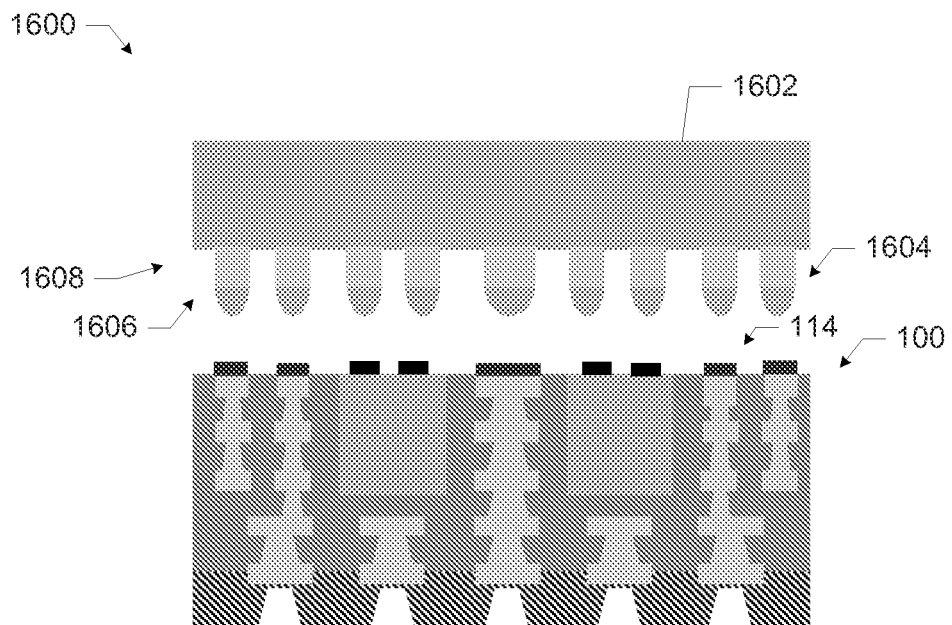

FIG. 16 illustrates an assembly 1600 subsequent to removing the film 1202 (e.g., by mechanical detachment) from the assembly 1500 (FIG. 15) to form the semiconductor package 100, and aligning a die 1602 with the semiconductor package 100. In particular, the die 1602 may have a surface 1608 on which a plurality of conductive contacts 1604 are disposed. Each conductive contact 1604 may have a solder bump 1606 disposed thereon. When the die 1602 is aligned with the semiconductor package 100 such that the surface 1608 faces the first side 114 of the semiconductor package 100, each of the plurality of conductive contacts 1604 may align with one of the conductive pads 104 of the bridge interconnects 102 or a contact 126 exposed on the first side 114 of the semiconductor package 100.

Figure 17:
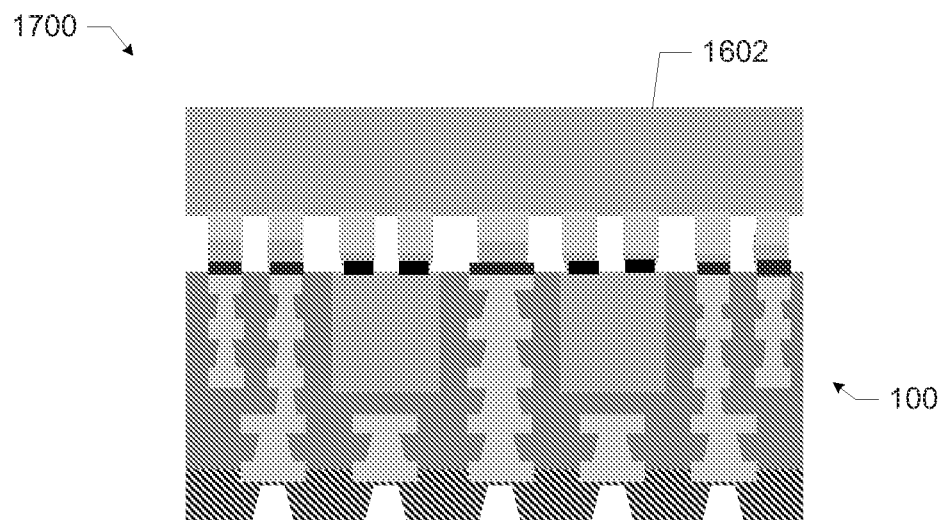

FIG. 17 illustrates an integrated circuit assembly 1700 subsequent to attaching the die 1602 to the semiconductor package 100 (of the assembly 1600 of FIG. 16) at the electrical contact points provided by the contacts 126 and the conductive pads 104 of the bridge interconnects 102. In the integrated circuit assembly 1700, each of the conductive contacts 1604 (FIG. 16) of the die 1602 may be in electrical contact with a contact 126 or with a conductive pad 104 of a bridge interconnect 102. In some embodiments, the die 1602 may be attached to the semiconductor package 100 using a thermal compression bonding process.

FIGS. 18-27 are side, cross-sectional views of assemblies subsequent to various operations in the manufacture of an integrated circuit assembly 2700 (FIG. 27) including the semiconductor package 100 of FIG. 2, in accordance with various embodiments. Although the operations illustrated in FIGS. 18-27 and discussed below are represented as occurring in a particular order, these operations may be performed in any suitable order, and various operations may be omitted or repeated as desired. Additionally, although FIGS. 18-27 illustrate various operations that may be used to manufacture the integrated circuit assembly 2700 including the semiconductor package 100 of FIG. 2, any other suitable set of operations for manufacturing the semiconductor package 100 and/or the integrated circuit assembly 2700 may be used instead of the operations discussed below.

Figure 18:
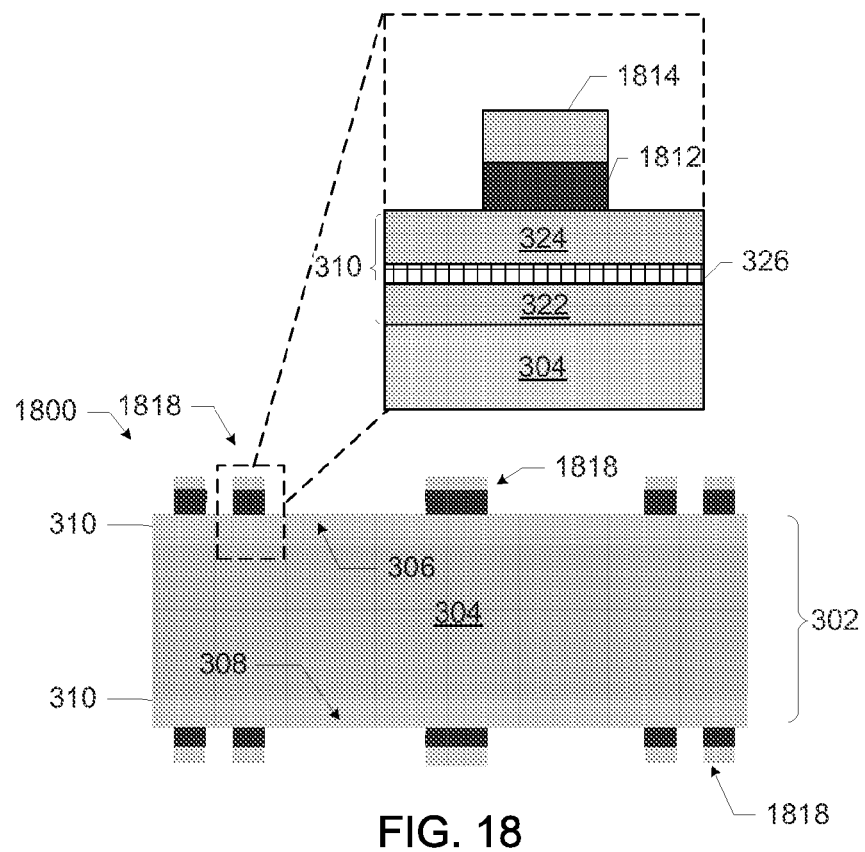
FIGS. 18-27 are side, cross-sectional views of assemblies subsequent to various operations in the manufacture of an integrated circuit assembly including the semiconductor package of FIG. 2, in accordance with various embodiments.

The manufacture of the integrated circuit assembly 2700 may begin with the assembly 1800 of FIG. 18. The assembly 1800 of FIG. 18 may have some similarities with the assembly 300 of FIG. 3, but may include metal structures 1818 on a first surface 306 and on a second surface 308 of a sacrificial core instead of metal structures 318. As discussed above with reference to FIG. 3, the sacrificial core 302 of the assembly 1800 may include a body material 304 disposed between foils 310. In some embodiments, a foil 310 may include an inner foil layer 322 (e.g., a copper foil), an outer foil layer 324 (e.g., a copper foil), and an adhesive layer 326 disposed between the inner foil layer 322 and the outer foil layer 324. The adhesive layer 326 may temporarily adhere the inner foil layer 322 to the outer foil layer 324 until the outer foil layer 324 and the inner foil layer 322 are "peeled apart." Thus, the adhesive layer 326 may act as a release layer for the release of the sacrificial core 302, enabling the inner foil layer 322 to be "peeled" away from the outer metal layer 324 once the body material 304 has been removed, providing a "peelable" core, as discussed above The foils 310 may provide the first surface 306 and the second surface 308 on which the metal structures 1818 may be disposed. The metal structures 1818 may include a first layer 1812 and a second layer 1814. In some embodiments, the first layer 1812 and the second layer 1814 may be formed of different materials. For example, in some embodiments, the first layer 1812 may be formed of nickel and the second layer 1814 may be formed of copper. Any suitable layer in the metal structure 1818 (e.g., the first layer 1812) may be formed by electroplating. In some embodiments, the second layer 1814 may form a contact 126 of the semiconductor assembly 100 of FIG. 2, as discussed below.

As discussed above with reference to FIG. 3, in some embodiments, the metal structures 1818 formed on the first surface 306 may be "mirror images" of the metal structures 1818 formed on the second surface 308 relative to the sacrificial core 302, as illustrated in FIG. 18. In some embodiments, most if not all manufacturing operations performed on the sacrificial core 302 may be performed so as to form mirror-image structures on the first surface 306 and the second surface 308 of the sacrificial core 302. Accordingly, for ease of illustration, only the structures formed on the first surface 306 (and the manufacturing operations related to the formation of those structures) may be discussed with reference to FIGS. 18-27. However, as noted, mirror-image structures may also be formed on the second surface 308 (e.g., by performing identical or analogous manufacturing operations).

FIG.
formed in accordance with the manufacturing operations discussed above with reference to FIGS. 3-11, or in accordance with any other suitable operations.

Figure 19:
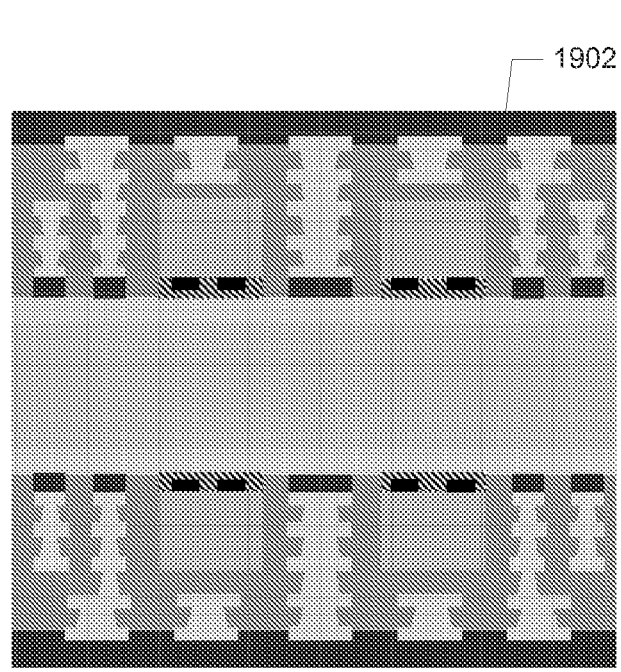

FIG. 19 illustrates an assembly 1900 subsequent to performing analogous operations on the assembly 1800 as were discussed above with reference to FIGS. 3-11 (e.g., the deposition of build-up material, the formation of vias and the placement of bridge interconnects), as well as subsequent to providing a film 1902 to the resulting assembly. In some embodiments, the film 1902 may be a PET material.

Figure 20:
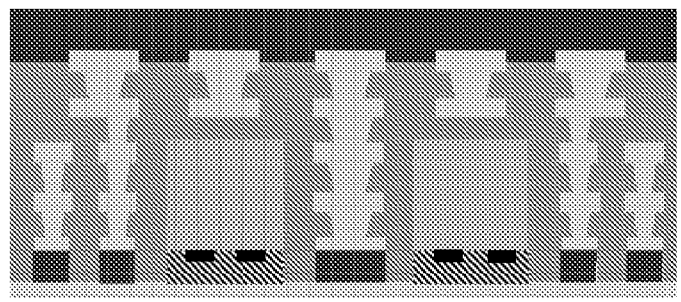

FIG. 20 illustrates an assembly 2000 subsequent to removing the body material 304 (FIG. 18) of the sacrificial core 302 from the assembly 1900 (FIG. 19) in a depaneling operation. The result of this removal may be the formation of two assemblies 2000 (due to the prior mirror-image manufacturing operations), but only one of the assemblies 2000 is shown in FIG. 20 for ease of illustration. The manufacturing operations discussed below with reference to FIGS. 21-27 may be performed on each of the two assemblies 2000 formed by the removal of the body material 304 in parallel, in series, or in any desired order. As discussed above with reference to FIG. 13, upon depaneling, the inner foil layer 322 may be removed, and only the outer foil layer 324 may remain as part of the assembly 2000.

Figure 21:
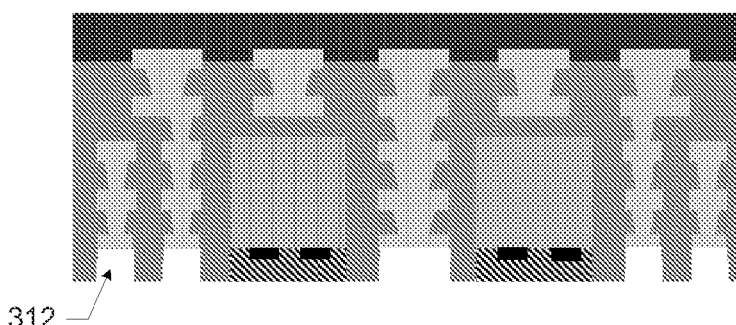

FIG. 21 illustrates an assembly 2100 subsequent to removing the outer foil layer 324 (FIG. 18) of the sacrificial core 302 from the assembly 1900 (FIG. 19) and removing the first layer 1812 of the metal structure 1818 (FIG. 18). Removal of the outer foil layer 324 and the first layer 1812 may be performed by etching (e.g., copper etching for the outer foil layer 324 and nickel etching for the first layer 1812). The removal of the first layer 1812 of the metal structures 1818 may expose the second layer 1814 of the metal structures 1818, which may form a contact 126.

Figure 22:
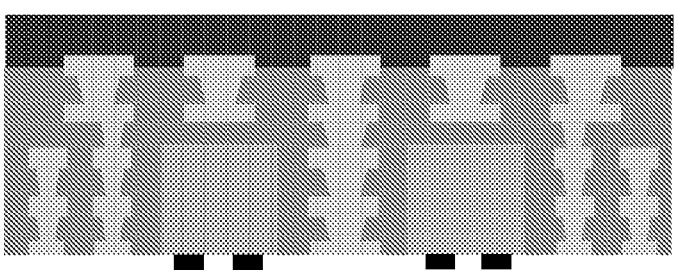

FIG. 22 illustrates an assembly 2200 subsequent to removing the die backside film 902 (FIG. 9) from the bridge interconnects 102 (e.g., from the first face 134 of the conductive pads 104) and also to removing the build-up material 110 disposed between the second layers 1814 of the metal structures 1818, and the build-up material 110 disposed between the second layers 1814 and the conductive pads 104 of the bridge interconnect 102.

Figure 23:
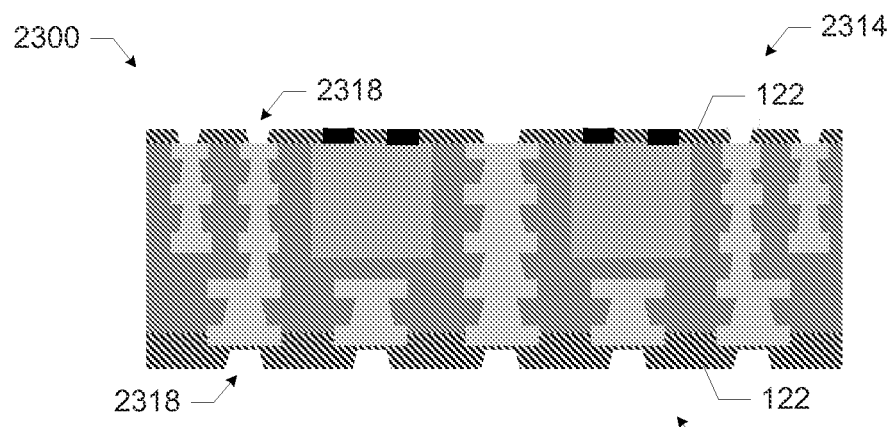

FIG. 23 illustrates an assembly 2300 subsequent to removing the film 1202 from the assembly 2200 (FIG. 22) and providing a patterned solder resist 122 on a first side 2314 and on a second side 2316 of the assembly 2300. The patterned solder resists 122 may expose various conductive structures in the assembly 2300 as shown. In particular, the patterned solder resist 122 may expose the conductive pads 104 of the bridge interconnects 102 on the first side 2314 of the assembly 2300. The pattern solder resist 122 may form cavities 2318, as shown.

Figure 24:
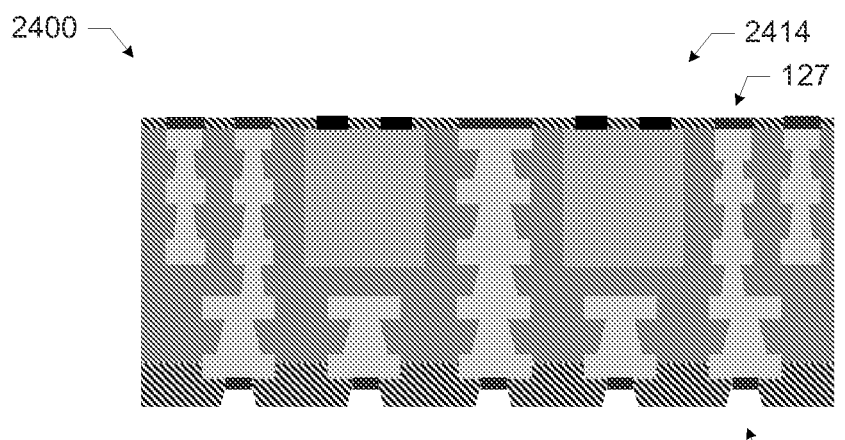

FIG. 24 illustrates an assembly 2400 subsequent to plating the assembly 2300 (FIG. 23) to form the contacts 126 (e.g., on the second layers 1814 of the metal structures 1818) in various ones of the cavities 2318. The conductive pads 104 of the bridge interconnects 102 may also be plated. The material plated onto the assembly 2400 may be, for example, nickel, palladium, or gold, and may be plated onto the assembly 2400 using an electrolytic process. This plating may be part of a surface finish process. The assembly 2400 may take the form of the semiconductor package 100 of FIG. 2 without the solder bumps 136. In particular, the conductive pads 104 and the contacts 126 on the first side 2414 of the assembly 2400 may be exposed.

Figure 25:
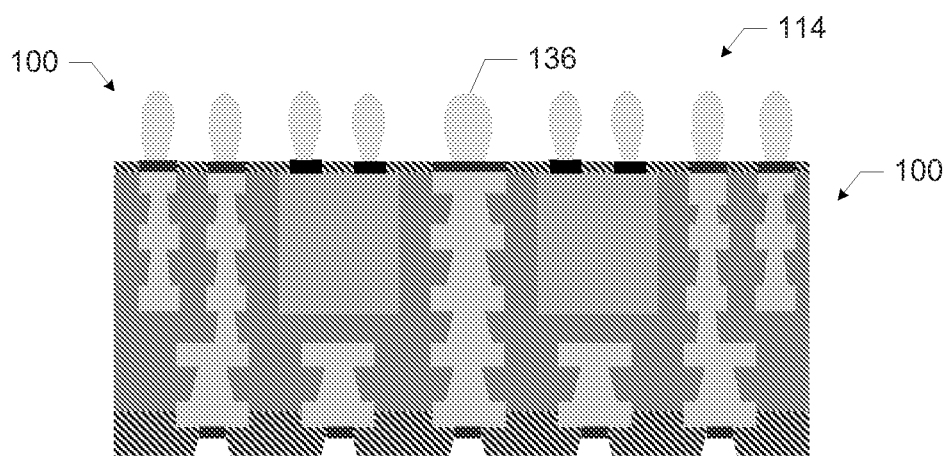

FIG. 25 illustrates the semiconductor package 100 of FIG. 2, subsequent to providing solder bumps 136 on the conductive pads 104 and the contacts 126 on the first side 2414 of the assembly 2400 (FIG. 24). The solder bumps 136 are thus disposed on the first side 114 of the semiconductor package 100. In some embodiments, the solder bumps 136 may be plated onto the assembly 2400.

Figure 26:
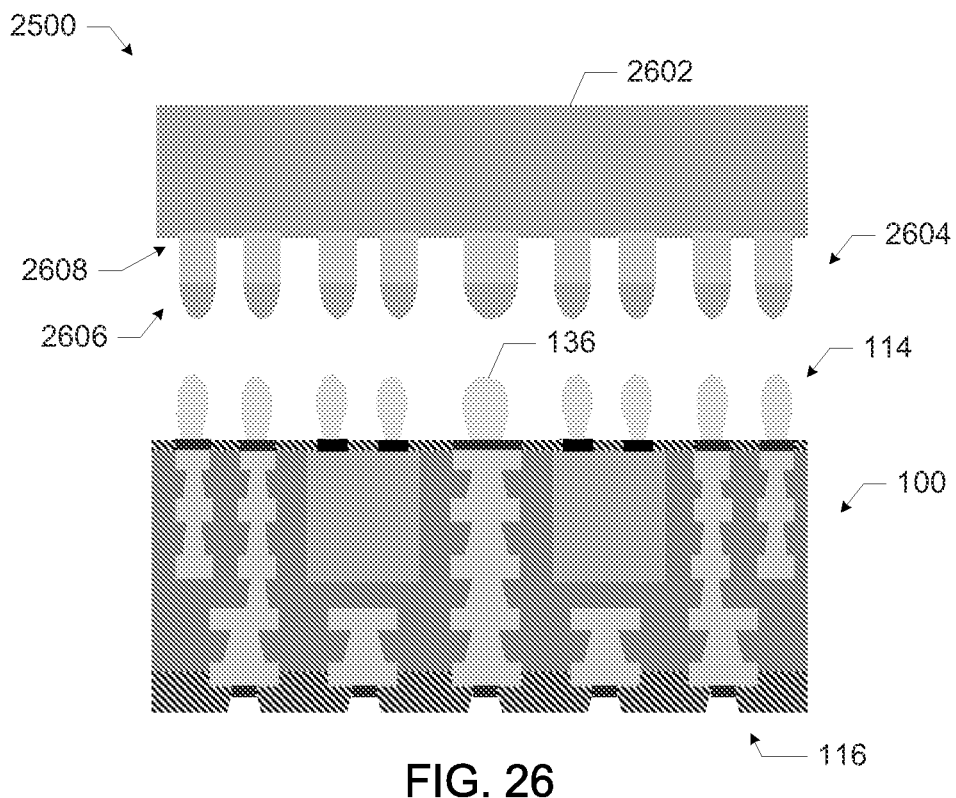

FIG. 26 illustrates the semiconductor package 100 of FIG. 2, subsequent to aligning a die 2602 with the semiconductor package 100. In particular, the die 2602 may have a surface 2608 on which a plurality of conductive contacts 2604 are disposed. Each conductive contact 2604 may have a solder bump 2606 disposed thereon. When the die 2602 is aligned with the semiconductor package 100 such that the surface 2608 faces the first side 114 of the semiconductor package 100, each of the plurality of conductive contacts 2604 may align with one of the solder bumps 136 exposed on the first side 114 of the semiconductor package 100 and disposed on the conductive pads 104 of the bridge interconnects 102 or the contact 126 exposed on the first side 114 of the semiconductor package 100.

Figure 27:
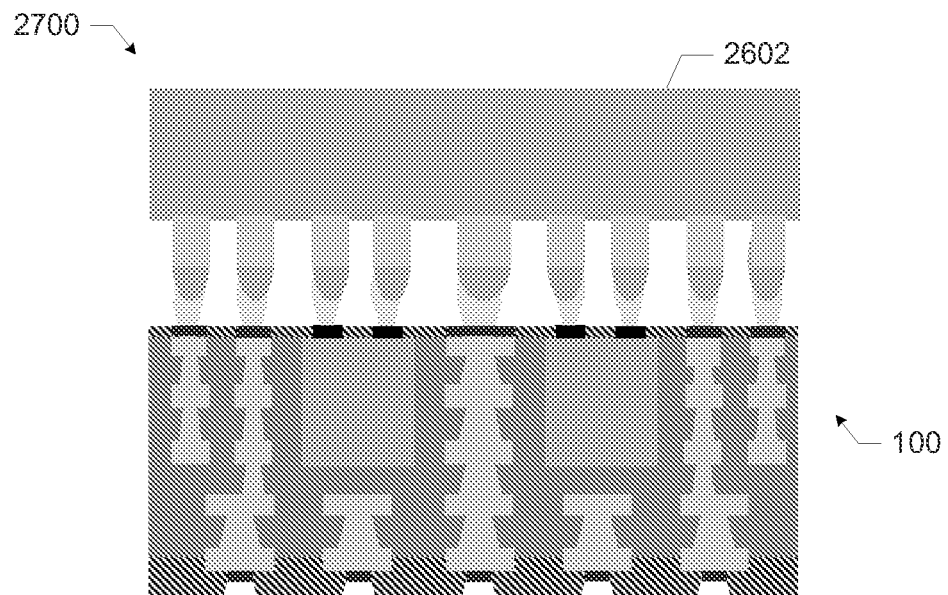

FIG. 27 illustrates an integrated circuit assembly 2700 subsequent to attaching the die 2602 to the semiconductor package 100 (of the assembly 2600 of FIG. 26) at the electrical contact points provided by the solder bumps 136 on the contacts 126 and the conductive pads 104 of the bridge interconnects 102. In the integrated circuit assembly 2700, each of the conductive contacts 2604 (FIG. 26) of the die 2602 may be in electrical contact with a contact 126 or with a conductive pad 104 of a bridge interconnect 102. In some embodiments, the die 2602 may be attached to the semiconductor package 100 using a thermal compression bonding process.

Figure 28:
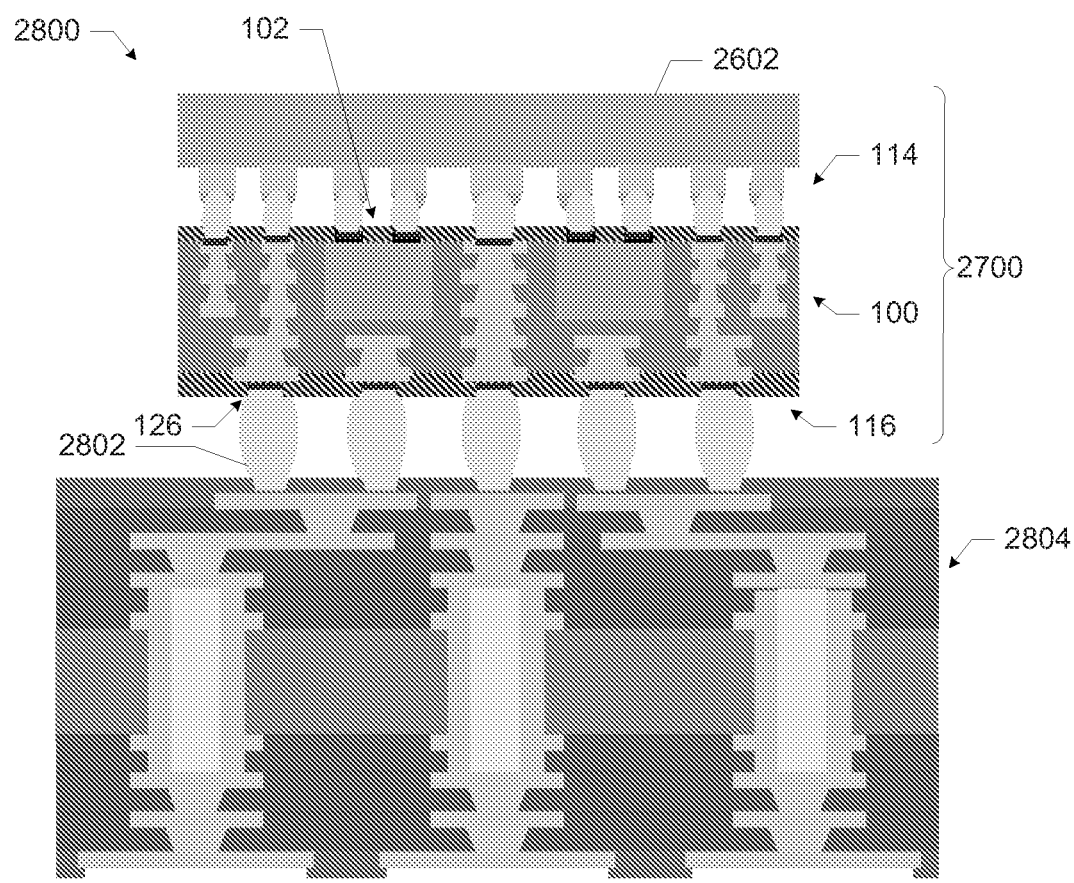
FIG. 28 is a side, cross-sectional view of an integrated circuit assembly including an interposer and a semiconductor package with an embedded bridge interconnect, in accordance with various embodiments.

FIG. 28 is a side, cross-sectional view of an integrated circuit assembly 2800 including an interposer 2804 and a semiconductor package 100 (e.g., the semiconductor package 100 of FIG. 1 or FIG. 2) with an embedded bridge interconnect 102, in accordance with various embodiments. In particular, the integrated circuit assembly 2800 may include the assembly 2700 (FIG. 27) coupled to the interposer 2804 by a plurality of solder bumps 2802 that electrically connect the contacts 126 on the second side 116 of the semiconductor package 100 with electrical contacts on the interposer 2804. The assembly 2700 may be referred to as a "coreless patch" in the configuration shown in FIG. 28. In some embodiments, the interposer 2804 may provide further cost reduction benefit by enabling dense routing on the expensive coreless patch, while the less dense routing may be done in the relatively cheaper organic interposer.

As discussed above with reference to FIGS. 3-27, some techniques for manufacturing the semiconductor packages disclosed herein may utilize a sacrificial core (e.g., the sacrificial core 302). In particular, the sacrificial core may provide a surface (or two surfaces) on which materials may be deposited and an assembly formed. The sacrificial core may be removed at a desired stage in the manufacturing process, and additional manufacturing operations may be performed on the remaining assembly.

Since the surface of the sacrificial core may serve as a "platform" on which additional materials are disposed during the formation of a semiconductor package, various internal or external surfaces of the resulting semiconductor package may have a profile complementary to a profile of the sacrificial core surface. That is, if the sacrificial core surface has a projection, the complementary surface may have a recess (and vice versa). If the surface of the sacrificial core is distorted, the complementary surface will be distorted in a complementary fashion.

However, if the surface of the sacrificial core is substantially flat, the complementary surface may also be substantially flat. In particular, if multiple components of a semiconductor package are each disposed a predetermined distance from a substantially flat (e.g., planar) surface of the sacrificial core, those components will be in a same plane upon removal of the sacrificial core. In this manner, a substantially flat surface of a sacrificial core may serve as a reference plane relative to which components of a semiconductor package may be arranged; upon removal of the sacrificial core, components previously disposed a common distance from the surface of the sacrificial core will be in a common plane. Even if the semiconductor package is subsequently distorted (causing these components to be no longer planar), applying forces to the semiconductor package to reverse the distortion will return the components to a common planar arrangement.

Figure 29:
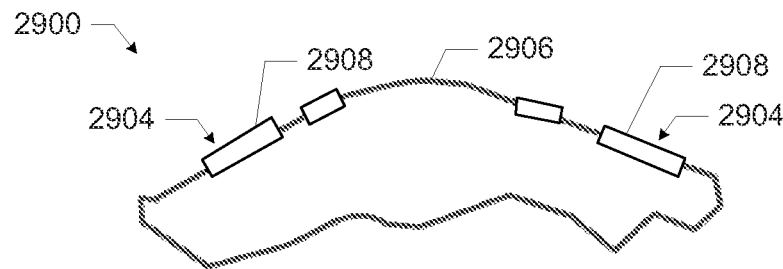
FIG. 29 is a side, cross-sectional view of a distorted surface having components disposed thereon, in accordance with various embodiments.
Figure 30:
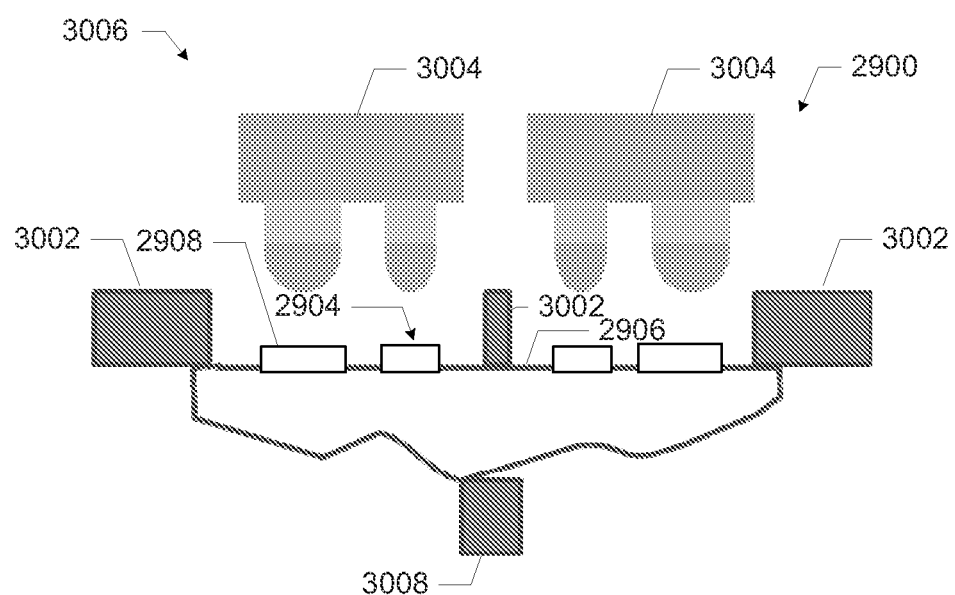
FIG. 30 is a side, cross-sectional view of the surface of FIG. 29 after flattening with a jig, in accordance with various embodiments.

FIGS. 29 and 30 illustrate this behavior. In particular, FIG. 29 is a side, cross-sectional view of a distorted surface 2906 of a semiconductor package 2900 having components 2904 (e.g., contacts/pads) disposed thereon. The components 2904 may have been formed on the surface 2906 so that the surfaces 2908 of the components 2904 are planar when the surface 2906 is flat, but distortion of the semiconductor package 2900 may cause the surfaces 2908 of the components 2904 to go out of plane.

FIG. 30 is a side, cross-sectional view of the surface 2906 of the semiconductor package 2900 of FIG. 29 after the surface 2906 is "flattened" with a jig 3006, in accordance with various embodiments. In particular, the jig 3006 may have one or more jig components 3002 disposed proximate to the surface 2906 and one or more jig components 3008 disposed on an opposing surface (not shown) to the surface 2906. The jig components 3002 and the jig components 3008 may apply forces in various directions so as to correct the distortion of the semiconductor package 2900 and "flatten" the surface 2906. When the surface 2906 is flat, the surfaces 2908 of the components 2904 may be planar (facilitating the coupling between, e.g., the dies 3004 and the semiconductor package 2900).

As noted above, in some embodiments, various components of the semiconductor packages 100 discussed herein may be arranged so as to have planar surfaces. For example, the semiconductor package 100 (e.g., of FIGS. 1 and 2) may be manufactured so that a first face 128 of the contact 126 may be in the same plane as the first face 134 of the conductive pads 104. Having these faces in substantially the same plane may facilitate quick and accurate attachment between the conductive pads on a die (e.g., the conductive contacts 1604 on the die 1602 of FIG. 16 or the conductive contacts 2604 on the die 2602 of FIG. 26) and the contact 126 and the conductive pads 104. If the first face 128 of the contact 126 and the first face 134 of the conductive pads 104 are not substantially in the same plane, attempts to attach a die to the first side 114 of the semiconductor package 100 may result in "gaps" between the die and the semiconductor package 100 (and thus in failed electrical connections).

Conventional manufacturing techniques typically attempt to align the conductive pads of a bridge interconnect and other outward-facing electrical contacts as one of the last stages in the manufacture of a semiconductor package. Achieving sufficient alignment at the "end" of the manufacturing process may require expensive and time-consuming tolerance control procedures, and even then may not achieve the desired coplanarity. Various ones of the manufacturing techniques disclosed herein may form semiconductor package structures "early" in a sacrificial core-based process so that the substantially flat surface of the sacrificial core may serve as a reference plane for alignment of the structures and so that minimal "stack-up" of manufacturing tolerances occurs to limit the accuracy within which the structures can be aligned. In particular, forming contacts in a build-up material (or structures on which contacts may be located) and positioning conductive pads of a bridge interconnect "close" to the surface of a sacrificial core may enable surfaces of the contacts and conductive pads to be aligned in a plane more accurately than previously achievable.

Although planar alignments are used as examples herein, any other suitable alignment may benefit from the techniques disclosed herein. For example, if one component of the semiconductor package 100 is to be disposed at a first distance from the first side 114, and a second component of the semiconductor package 100 is to be disposed at a second, different distance from the first side 114, manufacturing the semiconductor package 100 using a sacrificial core-based technique disclosed herein, and positioning the first and second components "early" in the fabrication process, may minimize stack-up variation and may enable the first and second components to be appropriately positioned.

As discussed above with reference to FIGS. 29 and 30, jigs may be used to hold a semiconductor package or other integrated circuit assembly in a desired position and orientation while that semiconductor package or other integrated circuit is coupled with another component (e.g., a die or an interposer). Various jig configurations may be used to "flatten" distorted surfaces and hold a component in place during assembly.

Figure 31:
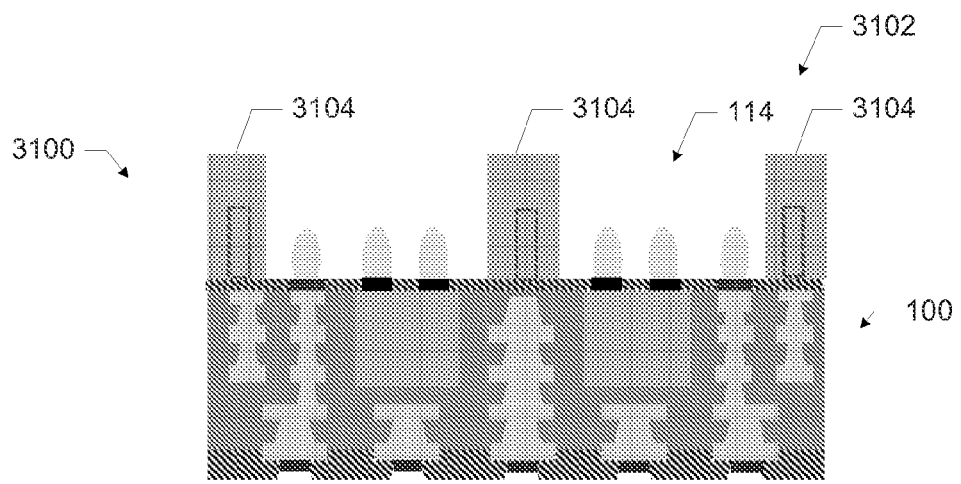
FIGS. 31-33 are side, cross-sectional views of the use of a jig in various operations in the manufacture of an integrated circuit assembly, in accordance with various embodiments.
Figure 32:
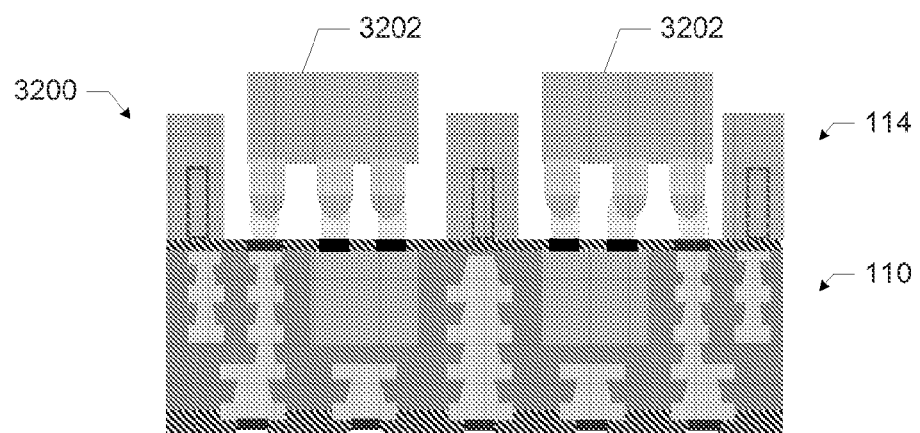
Figure 33:
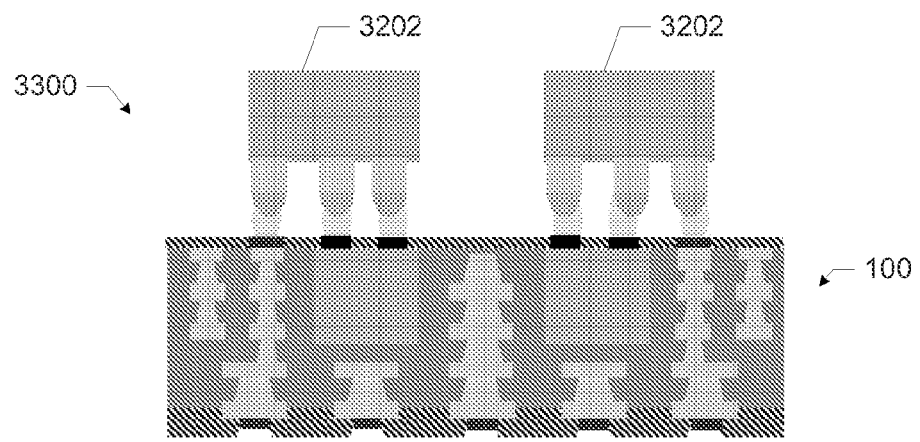

For example, FIGS. 31-33 are side, cross-sectional views of the use of a vacuum jig 3102 in various operations in the manufacture of an integrated circuit assembly 3300 including two dies 3202 and a semiconductor package 100 constructed similarly to the semiconductor package 100 of FIG. 2, in accordance with various embodiments. In particular, FIGS. 31-33 illustrate a "top jig holding" configuration, as discussed below.

FIG. 31 depicts an assembly 3100 subsequent to the application of two or more vacuum jig components 3104 of the vacuum jig 3102 to the first side 114 of the semiconductor package 100. The vacuum jig 3102 may be attached to the semiconductor package 100 to hold the first side 114 of the semiconductor package 100 flat. In particular, the vacuum jig components 3104 may apply a suction force to the first side 114 of the semiconductor package 100 at various points in order to correct distortion in the semiconductor package 100. In some embodiments, correcting distortion in the semiconductor package 100 may result in positioning the first face 134 of the conductive pads 104 in substantially the same plane as the first face 128 of the contact 126.

FIG. 32 depicts an assembly 3200 subsequent to the introduction of two dies 3202. The dies 3202 may include conductive contacts and solder bumps, and may be aligned with the semiconductor package 100 so that various ones of the conductive contacts may be electrically connected to the conductive pads 104 and the contacts 126. The dies 3202 may be attached to the first side 114 of the semiconductor package 100 while the vacuum jig 3102 is holding the first side 114 of the semiconductor package 100 flat. Any suitable technique may be used to attach the dies 3202 to the semiconductor package 100. For example, in some embodiments, a thermal compression bonding process may be used.

FIG. 33 depicts an integrated circuit assembly 3300 subsequent to the removal of the vacuum jig 3102 from the first side 114 of the semiconductor package 100 of the assembly 3200 (FIG. 32).

Figure 34:
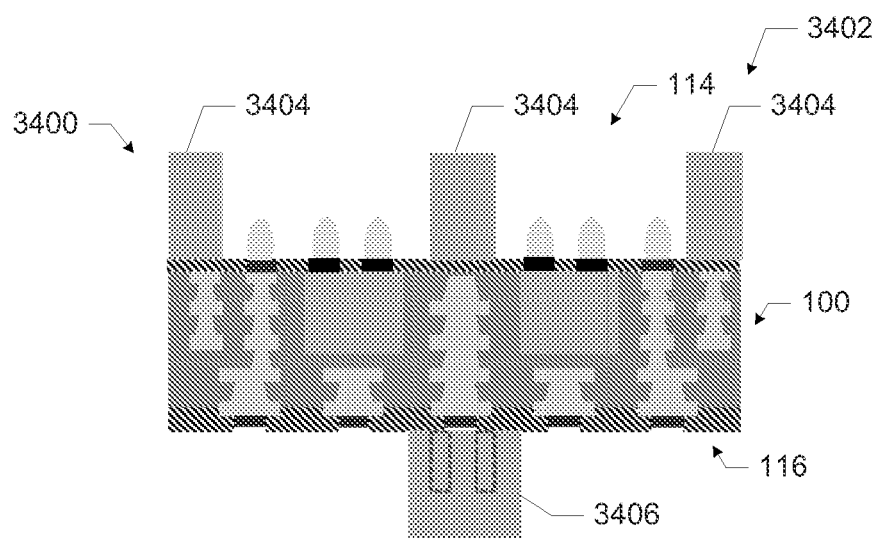
FIGS. 34-36 are side, cross-sectional views of the use of another jig in various operations in the manufacture of an integrated circuit assembly, in accordance with various embodiments.
Figure 35:
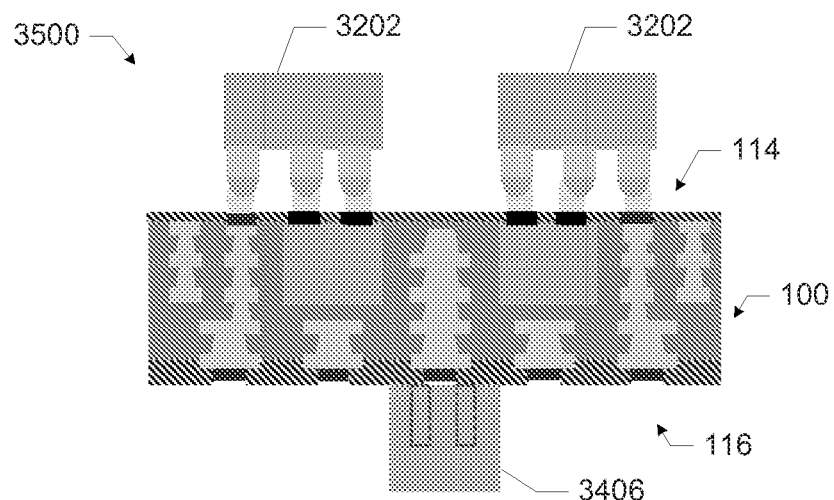
Figure 36:
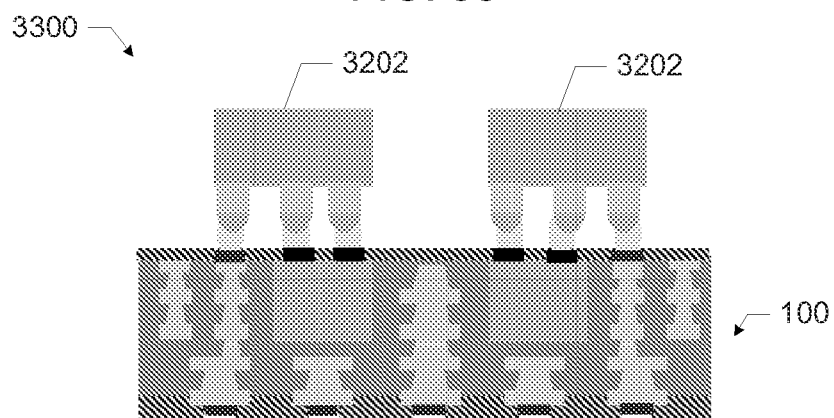

FIGS. 34-36 are side, cross-sectional views of the use of a jig 3402, different from the jig 3102 of FIGS. 31-33, in various operations in the manufacture of an integrated circuit assembly 3300 including two dies 3202 and a semiconductor package 100 constructed similarly to the semiconductor package 100 of FIG. 2, in accordance with various embodiments. The operations illustrated in FIGS. 34-36 may be performed instead of the operations illustrated in FIGS. 31-33, in some embodiments. In particular, FIGS. 34-36 illustrate a "bottom jig holding" configuration, as discussed below.

FIG. 34 depicts an assembly 3400 subsequent to the application of two or more non-vacuum jig components 3404 of the vacuum jig 3402 to the first side 114 of the semiconductor package 100, and the application of one or more vacuum jig components 3406 of the vacuum jig 3402 to the second side 116 of the semiconductor package 100. The vacuum jig 3402 may be attached to the semiconductor package 100 to hold the first side 114 of the semiconductor package 100 flat. In particular, the jig components 3404 may apply a suction force to the second side 116 of the semiconductor package 100 at one or more points, and the non-vacuum jig components 3404 of the vacuum jig 3402 may apply a contact force to the first side 114 of the semiconductor package 100 at one or more points, in order to correct distortion in the semiconductor package 100. The vacuum jig components 3406 may push the semiconductor package 100 against the non-vacuum jig components 3404 to "flatten" the first side 114 of the semiconductor package 100. In some embodiments, correcting distortion in the semiconductor package 100 may result in positioning the first face 134 of the conductive pads 104 in substantially the same plane as the first face 128 of the contact 126.

FIG. 35 depicts an assembly 3500 subsequent to removal of non-vacuum jig components 3404, followed by the introduction of two dies 3202, to the assembly 3400 (FIG. 34). The dies 3202 may include conductive contacts and solder bumps, and may be aligned with the semiconductor package 100 so that various ones of the conductive contacts may be electrically connected to the conductive pads 104 and the contacts 126. The dies 3202 may be attached to the first side 114 of the semiconductor package 100 while the vacuum jig component 3406 is holding the semiconductor package 100 so that the first side 114 of the semiconductor package 100 remains flat. Any suitable technique may be used to attach the dies 3202 to the semiconductor package 100. For example, in some embodiments, a thermal compression bonding process may be used.

FIG. 36 depicts an integrated circuit assembly 3300 subsequent to the removal of the vacuum jig component 3406 from the second side 116 of the semiconductor package 100 of the assembly 3500 (FIG. 35).

Figure 37:
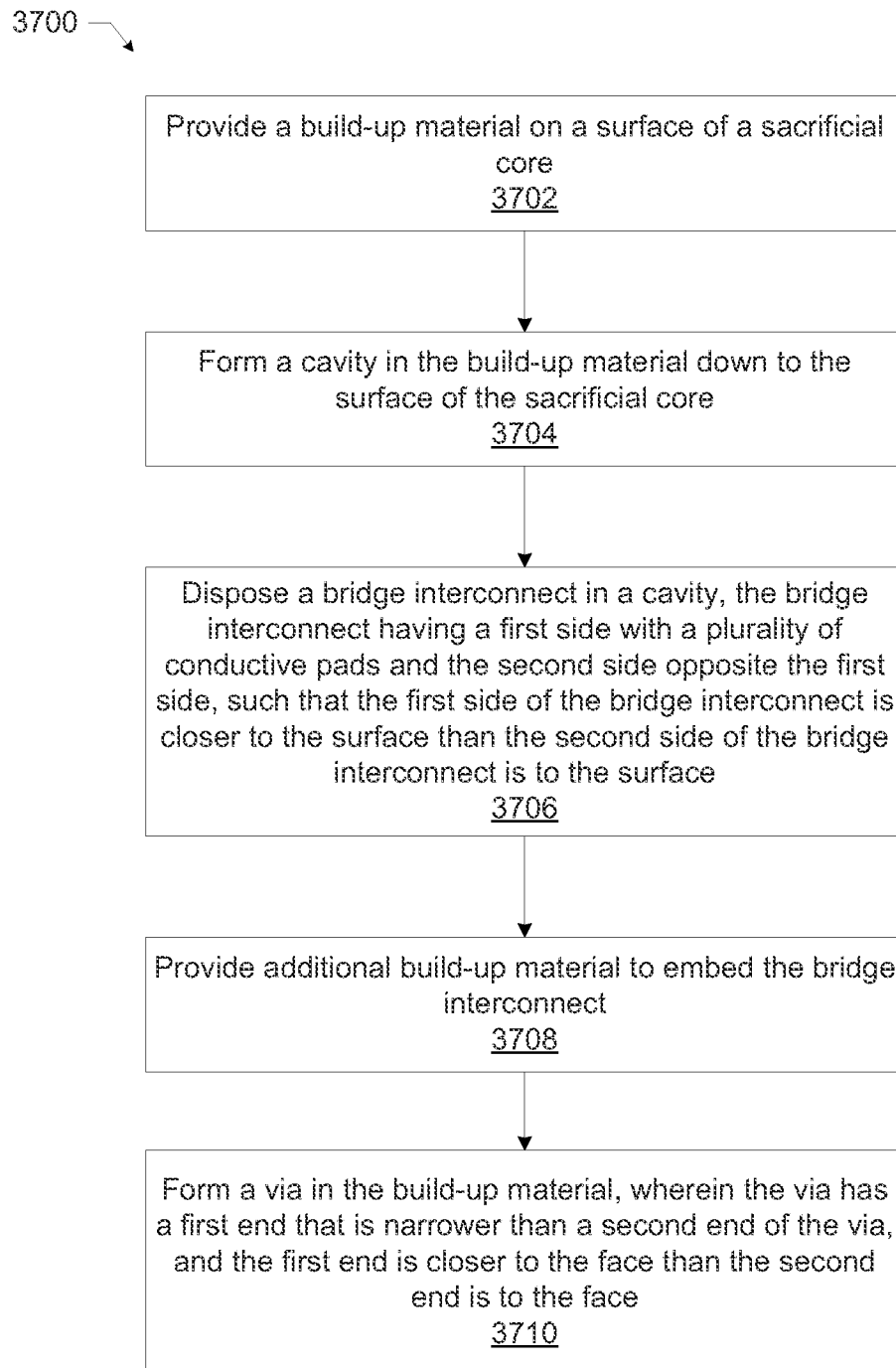
FIG. 37 is a flow diagram of a method for manufacturing a semiconductor package, in accordance with various embodiments.

FIG. 37 is a flow diagram of a method 3700 for manufacturing a semiconductor package, in accordance with various embodiments. Although the method 3700 may be advantageously used to form any suitable ones of the embodiments of the semiconductor packages 100 disclosed herein, any suitable semiconductor packages 100 may be manufactured using the method 3700.

At 3702, a build-of material may be provided on a face of a sacrificial core.

At 3704, a cavity may be formed in the build-up material. In some embodiments, the cavity may extend down to the face of the sacrificial core.

At 3706, a bridge interconnect may be disposed in the cavity formed at 3704. The bridge interconnect may have a first side with a plurality of conductive pads and a second side opposite the first side. The bridge interconnect may be disposed in the cavities such that the first side of the bridge interconnect is closer to the face of the sacrificial core than the second side of the bridge interconnect is to the face of the sacrificial core.

At 3708, additional build-up material may be provided to embed the bridge interconnect.

At 3710, a via may be formed in the build-up material. The via may extend through a portion of the build-up material, and may have a first end that is narrower than a second end of the via. The first end of the via may be closer to the face of the sacrificial core than the second end of the via is to the face of the sacrificial core.

The method 3700 may include additional operations in various embodiments. For example, in some embodiments, after the via is formed in the build-up material at 3710, the sacrificial core may be removed to expose the conductive pads of the bridge interconnect.

In some embodiments, the face of the sacrificial core discussed above with reference to 3702 may be a first face of the sacrificial core, and the sacrificial core may have a second face opposite the first face. In some such embodiments, the method 3700 may also include providing a second build-up material on the second face of the sacrificial core; forming a second cavity in the second build-up material down to the second face of the sacrificial core; disposing a second bridge interconnect in the second cavity, the second bridge interconnect having a first side with a plurality of conductive pads and a second side opposite the first side, such that the first side of the second bridge interconnect is closer to the second face than the second side of the second bridge interconnect is to the second face; providing additional second build-up material to embed the second bridge interconnect; and forming a second via in the second build-up material, wherein the second via extends through a portion of the second build-up material, has a first end that is narrower than a second end of the second via, and the first end is closer to the face than the second end is to the face.

Figure 38:
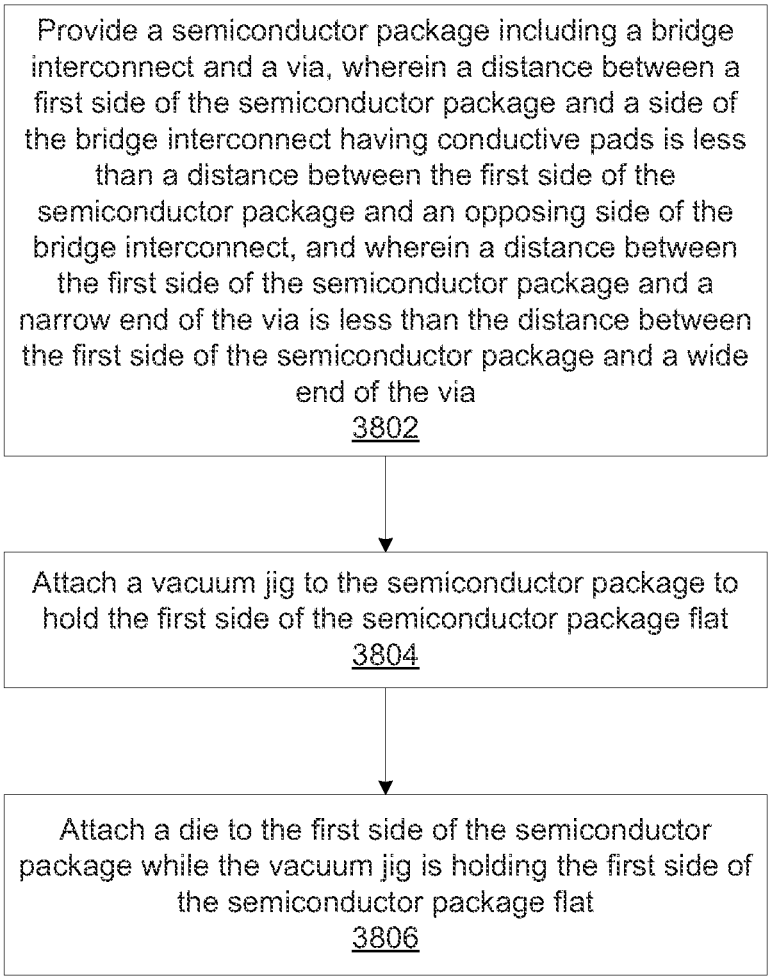
FIG. 38 is a flow diagram of a method of manufacturing an integrated circuit assembly, in accordance with various embodiments.

FIG. 38 is a flow diagram of a method 3800 of manufacturing an integrated circuit assembly, in accordance with various embodiments. Although the method 3800 may be advantageously used to form any suitable ones of the embodiments of the integrated circuit assemblies including the semiconductor packages 100 disclosed herein, any suitable integrated circuit assemblies may be manufactured using the method 3800.

At 3802, a semiconductor package may be provided. The semiconductor package may include a bridge interconnect embedded in a build-up material, the bridge interconnect having a first side with a plurality of conductive pads and a second side opposite the first side. The semiconductor package may also include a via extending through a portion of the build-up material, the via having a first end that is narrower than a second end of the via. The semiconductor package may be arranged such that the semiconductor package has a first side and an opposing second side, the bridge interconnect is arranged in the semiconductor package such that a distance between the first side of the bridge interconnect and the first side of the semiconductor package is less than a distance between the second side of the bridge interconnect and the first side of the semiconductor package, and the via is arranged in the semiconductor package such that a distance between the first end of the via and the first side of the semiconductor package is less than a distance between the second end of the via and the first side of the semiconductor package. In some embodiments, at least a portion of the first side of the semiconductor package may have a profile complementary to a profile of a surface of a sacrificial core.

At 3804, a vacuum jig may be attached to the semiconductor package of 3802. The vacuum jig may hold the first side of the semiconductor package flat. In some embodiments, the vacuum jig may include first vacuum jig components, and attaching the vacuum jig to the semiconductor package at 3804 may include attaching the first vacuum jig components to the first side of the semiconductor package. In some embodiments, the vacuum jig may include second vacuum jig components, and attaching the vacuum jig to the semiconductor package at 3804 may include attaching the second vacuum jig components to the second side of the semiconductor package. In some such embodiments, first jig components (which may be non-vacuum components) may be applied to the first side of the semiconductor package (e.g., prior to attaching the second vacuum jig components to the second side of the semiconductor package).

At 3806, a die may be attached to the first side of the semiconductor package. The die may be attached while the vacuum jig is holding the first side of the semiconductor package flat. In some embodiments, one or more components of the vacuum jig may be removed from contact with the semiconductor package prior to attachment of the die to the first side of the semiconductor package at 3806. In some embodiments, attaching the die to the first side of the semiconductor package at 3806 may include performing a thermal compression bonding process to attach the die to the first side of the semiconductor package.

Figure 39:
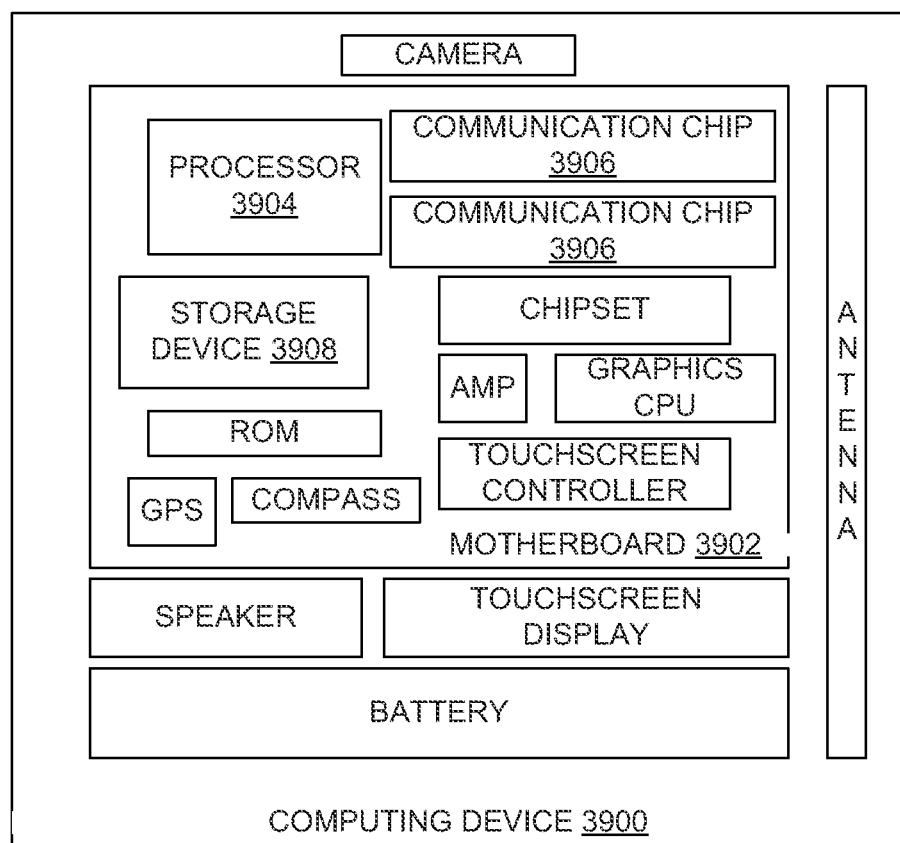
FIG. 39 is a block diagram of an example computing device that may include one or more of any of the semiconductor packages disclosed herein.

Embodiments of the present disclosure may be implemented into any device that may benefit from the semiconductor packages, and related assemblies and techniques, disclosed herein. FIG. 39 schematically illustrates a computing device 3900, in accordance with some implementations, which may include integrated circuits having components formed and operating in accordance with one or more of the embodiments disclosed herein (e.g., any of the semiconductor packages 100).

The computing device 3900 may be, for example, a mobile communication device or a desktop or rack-based computing device. The computing device 3900 may house a board such as a motherboard 3902. The motherboard 3902 may include a number of components, including (but not limited to) a processor 3904 and at least one communication chip 3906. Any of the components discussed herein with reference to the computing device 3900 may be a semiconductor package or integrated circuit in accordance with any of the embodiments disclosed herein. The processor 3904 may be physically and electrically coupled to the motherboard 3902. The term "processor" may refer to any device or portion of a device that processes electronic data from registers and/or memory to transform that electronic data into other electronic data that may be stored in registers and/or memory. In some implementations, the at least one communication chip 3906 may also be physically and electrically coupled to the motherboard 3902. In further implementations, the communication chip 3906 may be part of the processor 3904.

The computing device 3900 may include a storage device 3908. In some embodiments, the storage device 3908 may include one or more solid state drives. Examples of storage devices that may be included in the storage device 3908 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 3900 may include other components that may or may not be physically and electrically coupled to the motherboard 3902. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera. In various embodiments, any one or more of these components may include semiconductor packages in accordance with the present disclosure.

The communication chip 3906 and the antenna may enable wireless communications for the transfer of data to and from the computing device 3900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 3906 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide area (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 3906 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 3906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 3906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 3906 may operate in accordance with other wireless protocols in other embodiments.

The computing device 3900 may include a plurality of communication chips 3906. For instance, a first communication chip 3906 may be dedicated to shorter range wireless communications such as Wi-Fi and Bluetooth, and a second communication chip 3906 may be dedicated to longer range wireless communications such as GPS, EDGE, GPRS, CDMA, WiMAX, LTE, EV-DO, and others. In some embodiments, the communication chip 3906 may support wired communications. For example, the computing device 3900 may include one or more wired servers.

In various implementations, the computing device 3900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 3900 may be any other electronic device that processes data. In some embodiments, the semiconductor packages disclosed herein may be implemented in a high-performance computing device.

The following paragraphs provide examples of the embodiments disclosed herein.

Example 1 is a semiconductor package, including: a bridge interconnect embedded in a build-up material, the bridge interconnect having a first side with a plurality of conductive pads and a second side opposite the first side; and a via extending through a portion of the build-up material, the via having a first end that is narrower than a second end of the via. The semiconductor package has a first side and an opposing second side, the bridge interconnect is arranged in the semiconductor package such that a distance between the first side of the bridge interconnect and the first side of the semiconductor package is less than a distance between the second side of the bridge interconnect and the first side of the semiconductor package, and the via is arranged in the semiconductor package such that a distance between the first end of the via and the first side of the semiconductor package is less than a distance between the second end of the via and the first side of the semiconductor package.

Example 2 may include the subject matter of Example 1, and may further include solder resist disposed on the second side of the semiconductor package.

Example 3 may include the subject matter of any of Examples 1-2, and may further specify that the second side is a first layer interconnect side and the first side of the semiconductor package is a second layer interconnect side.

Example 4 may include the subject matter of Example 3, and may further include solder resist disposed on the second layer interconnect side.

Example 5 may include the subject matter of any of Examples 1-4, and may further include a contact, formed from a material different from a material of the conductive pads, having a first face and an opposing second face. The conductive pads have a first face and a second face opposite the first face, wherein the second face contacts a body of the bridge interconnect, and the first faces of the conductive pads of the bridge interconnect are in approximately a same plane as the first face of the contact.

Example 6 may include the subject matter of Example 5, and may further specify that the contact and the conductive pads are disposed on the first side of the semiconductor package and are positioned for coupling with one or more dies.

Example 7 may include the subject matter of Example 5, and may further specify that the contact comprises nickel.

Example 8 may include the subject matter of Example 5, and may further specify that the conductive pads are coated in nickel.

Example 9 may include the subject matter of any of Examples 1-8, and may further include a solder bump disposed on each of the conductive pads.

Example 10 may include the subject matter of any of Examples 1-9, and may further specify that the build-up material is an organic build-up material.

Example 11 may include the subject matter of Example 10, and may further specify that the bridge interconnect is a silicon bridge.

Example 12 may include the subject matter of any of Examples 1-11, and may further specify that the conductive pads are not in electrical contact with any vias in the build-up material.

Example 13 may include the subject matter of any of Examples 1-12, and may further specify that a sacrificial core is disposed between the semiconductor package and a second semiconductor package, the second semiconductor package forming a mirror image of the semiconductor package across the sacrificial core.

Example 14 may include the subject matter of any of Examples 1-13, and may further specify that at least a portion of the first side of the semiconductor package has a profile complementary to a profile of a surface of the sacrificial core.

Example 15 is an integrated circuit assembly, including a die and a semiconductor package, including: a bridge interconnect embedded in a build-up material, the bridge interconnect having a first side with a plurality of conductive pads and a second side opposite the first side, and a via extending through a portion of the build-up material, the via having a first end that is narrower than a second end of the via. The semiconductor package has a first side and an opposing second side, the bridge interconnect is arranged in the semiconductor package such that a distance between the first side of the bridge interconnect and the first side of the semiconductor package is less than a distance between the second side of the bridge interconnect and the first side of the semiconductor package, the via is arranged in the semiconductor package such that a distance between the first end of the via and the first side of the semiconductor package is less than a distance between the second end of the via and the first side of the semiconductor package, and the die is electrically coupled to the bridge interconnect at the plurality of conductive pads.

Example 16 may include the subject matter of Example 15, and may further specify that the plurality of conductive pads are not spaced apart by a solder resist material.

Example 17 may include the subject matter of any of Examples 15-16, and may further include an interposer; wherein the second side of the semiconductor package is a first layer interconnect side, and wherein the interposer is electrically coupled to the semiconductor package at the first layer interconnect side.

Example 18 is a method for manufacturing a semiconductor package, including: providing a build-up material on a surface of a sacrificial core; forming a cavity in the build-up material down to the surface of the sacrificial core; disposing a bridge interconnect in the cavity, the bridge interconnect having a first side with a plurality of conductive pads and a second side opposite the first side, such that the first side of the bridge interconnect is closer to the surface than the second side of the bridge interconnect is to the surface; providing additional build-up material to embed the bridge interconnect; and forming a via in the build-up material, wherein the via extends through a portion of the build-up material, has a first end that is narrower than a second end of the via, and the first end is closer to the surface than the second end is to the surface.

Example 19 may include the subject matter of Example 18, and may further include removing the sacrificial core to expose the bridge interconnect.

Example 20 may include the subject matter of any of Examples 18-19, and may further specify that the surface is a first surface and the sacrificial core has a second surface opposite the first surface. Example 20 may further include: providing a second build-up material on the second surface of the sacrificial core; forming a second cavity in the second build-up material down to the second surface of the sacrificial core; disposing a second bridge interconnect in the second cavity, the second bridge interconnect having a first side with a plurality of conductive pads and a second side opposite the first side, such that the first side of the second bridge interconnect is closer to the second surface than the second side of the second bridge interconnect is to the second surface; providing additional second build-up material to embed the second bridge interconnect; and forming a second via in the second build-up material, wherein the second via extends through a portion of the second build-up material, has a first end that is narrower than a second end of the second via, and the first end is closer to the second surface than the second end is to the second surface.

Example 21 is a method of manufacturing an integrated circuit assembly, including providing a semiconductor package. The semiconductor package includes a bridge interconnect embedded in a build-up material, the bridge interconnect having a first side with a plurality of conductive pads and a second side opposite the first side, and a via extending through a portion of the build-up material, the via having a first end that is narrower than a second end of the via, wherein the semiconductor package has a first side and an opposing second side, the bridge interconnect is arranged in the semiconductor package such that a distance between the first side of the bridge interconnect and the first side of the semiconductor package is less than a distance between the second side of the bridge interconnect and the first side of the semiconductor package, the via is arranged in the semiconductor package such that a distance between the first end of the via and the first side of the semiconductor package is less than a distance between the second end of the via and the first side of the semiconductor package. Example 21 further includes attaching a vacuum jig to the semiconductor package to hold the first side of the semiconductor package flat; and attaching a die to the first side of the semiconductor package while the vacuum jig is holding the first side of the semiconductor package flat.

Example 22 may include the subject matter of Example 21, and may further specify that the vacuum jig includes a first vacuum jig component and attaching the vacuum jig to the semiconductor package includes attaching the first vacuum jig component to the first side of the semiconductor package.

Example 23 may include the subject matter of any of Examples 21-22, and may further specify that the vacuum jig includes a second vacuum jig component, attaching the vacuum jig to the semiconductor package includes attaching the second vacuum jig component to the second side of the semiconductor package.

Example 23 further includes, prior to attaching the second vacuum jig component to the second side of the semiconductor package, applying a first jig component to the first side of the semiconductor package; and, prior to attaching the die to the first side of the semiconductor package, removing the first jig component from contact with the first side of the semiconductor package.

Example 24 may include the subject matter of any of Examples 21-23, and may further specify that attaching the die to the first side of the semiconductor package includes performing a thermal compression bonding process to attach the die to the first side of the semiconductor package.

Example 25 may include the subject matter of any of Examples 21-24, and may further specify that at least a portion of the first side of the semiconductor package has a profile complementary to a profile of a surface of a sacrificial core.

What is claimed is:

1. A semiconductor package, comprising:
   a build-up material;
   a bridge interconnect embedded in the build-up material, the bridge interconnect having a first side with a plurality of conductive pads disposed on a first side of the semiconductor package, and a second side opposite the first side, wherein the semiconductor package has an opposing second side, wherein the conductive pads have a first face and a second face opposite the first face, wherein the second face contacts a body of the bridge interconnect;
   a via extending through a portion of the build-up material, the via having a first end coupled with a contact disposed on the first side of the semiconductor package, wherein the contact has a first face and an opposing second face wherein the first face of the contact is disposed approximately in a same plane with respective first faces of the conductive pads, wherein the contact is formed from a material that is different from a material of the conductive pads; and
   a sacrificial core disposed between the semiconductor package and another semiconductor package to be coupled with the semiconductor package, wherein the other semiconductor package is to form a mirror image of the semiconductor package across the sacrificial core.

2. The semiconductor package of claim 1, further comprising:
   solder resist disposed on the second side of the semiconductor package.

3. The semiconductor package of claim 1, wherein the second side is a first layer interconnect side and the first side of the semiconductor package is a second layer interconnect side.

4. The semiconductor package of claim 3, further comprising:
   solder resist disposed on the second layer interconnect side.

5. The semiconductor package of claim 1, wherein the contact and the conductive pads disposed on the first side of the semiconductor package are positioned for coupling with one or more dies.

6. The semiconductor package of claim 1, wherein the contact comprises nickel.

7. The semiconductor package of claim 1, wherein the conductive pads are coated in nickel.

8. The semiconductor package of claim 1, further comprising:
   a solder bump disposed on each of the conductive pads.

9. The semiconductor package of claim 1, wherein the build-up material is an organic build-up material.

10. The semiconductor package of claim 9, wherein the bridge interconnect is a silicon bridge.

11. The semiconductor package of claim 1, wherein the conductive pads are free from electrical contact with any vias in the build-up material.

12. The semiconductor package of claim 1, wherein at least a portion of the first side of the semiconductor package has a profile complementary to a profile of a surface of the sacrificial core.

13. An integrated circuit assembly, comprising:
   a die;
   a semiconductor package, comprising:
      a bridge interconnect embedded in a build-up material, the bridge interconnect having a first side with a plurality of conductive pads disposed on a first side of the semiconductor package, and a second side opposite the first side, wherein the semiconductor package has an opposing second side, wherein the conductive pads have a first face and a second face opposite the first face, wherein the second face contacts a body of the bridge interconnect; and
      a via that extends through a portion of the build-up material, the via having a first end coupled with a contact disposed on the first side of the semiconductor package, wherein the contact has a first face and an opposing second face; and
   an interposer,
      wherein the first face of the contact is disposed approximately in a same plane with respective first faces of the conductive pads, and the die is electrically coupled to the bridge interconnect at the plurality of conductive pads, and wherein the second side of the semiconductor package is a layer interconnect side, and wherein the interposer is electrically coupled to the semiconductor package at the layer interconnect side.

14. The integrated circuit assembly of claim 13, wherein the plurality of conductive pads are free from being spaced apart by a solder resist material.

15. A method for manufacturing a semiconductor package, comprising:
   providing a build-up material on a surface of a sacrificial core;
   forming a cavity in the build-up material down to the surface of the sacrificial core;
   disposing a bridge interconnect in the cavity, the bridge interconnect having a first side with a plurality of conductive pads and a second side opposite the first side, such that the first side of the bridge interconnect is closer to the surface than the second side of the bridge interconnect is to the surface;
   providing additional build-up material to embed the bridge interconnect; and
   forming a via in the build-up material, wherein the via extends through a portion of the build-up material, has a first end that is narrower than a second end of the via, and the first end is closer to the surface than the second end is to the surface.

16. The method of claim 15, further comprising:
   removing the sacrificial core to expose the bridge interconnect.

17. The method of claim 15, wherein the surface is a first surface and the sacrificial core has a second surface opposite the first surface, and wherein the method further comprises:
   providing a second build-up material on the second surface of the sacrificial core;
   forming a second cavity in the second build-up material down to the second surface of the sacrificial core;
   disposing a second bridge interconnect in the second cavity, the second bridge interconnect having a first side with a plurality of conductive pads and a second side opposite the first side, such that the first side of the second bridge interconnect is closer to the second surface than the second side of the second bridge interconnect is to the second surface;

providing additional second build-up material to embed the second bridge interconnect; and forming a second via in the second build-up material, wherein the second via extends through a portion of the second build-up material, has a first end that is narrower than a second end of the second via, and the first end is closer to the second surface than the second end is to the second surface.

18. A method of manufacturing an integrated circuit assembly, comprising:

embedding a bridge interconnect in a build-up material of a semiconductor package, the bridge interconnect having a first side with a plurality of conductive pads and a second side opposite the first side, wherein the conductive pads have a first face and a second face opposite the first face, wherein embedding includes disposing the plurality of conductive pads on a first side of the semiconductor package such that the second face contacts a body of the bridge interconnect; and extending a via through a portion of the build-up material, including forming a contact on the first side of the semiconductor package, wherein the contact has a first face and an opposing second face, wherein disposing includes disposing the first face of the contact to be approximately in a same plane with respective first faces of the conductive pads; and coupling the via with the contact;

attaching a vacuum jig to the semiconductor package to hold the first side of the semiconductor package flat; and attaching a die to the first side of the semiconductor package.

19. The method of claim 18, wherein the vacuum jig comprises a first vacuum jig component and attaching the vacuum jig to the semiconductor package comprises attaching the first vacuum jig component to the first side of the semiconductor package.

20. The method of claim 18, wherein the vacuum jig comprises a second vacuum jig component, attaching the vacuum jig to the semiconductor package comprises attaching the second vacuum jig component to the second side of the semiconductor package, and the method further comprises:

prior to attaching the second vacuum jig component to the second side of the semiconductor package, applying a first jig component to the first side of the semiconductor package; and prior to attaching the die to the first side of the semiconductor package, removing the first jig component from contact with the first side of the semiconductor package.

21. The method of claim 18, wherein attaching the die to the first side of the semiconductor package comprises performing a thermal compression bonding process to attach the die to the first side of the semiconductor package.

22. The method of claim 18, wherein at least a portion of the first side of the semiconductor package has a profile complementary to a profile of a surface of a sacrificial core.

* * * * *